(12) United States Patent
Hiroshiro et al.

(10) Patent No.: US 8,522,712 B2
(45) Date of Patent: Sep. 3, 2013

(54) TEMPLATE TREATMENT METHOD, PROGRAM, COMPUTER STORAGE MEDIUM, TEMPLATE TREATMENT APPARATUS AND IMPRINT SYSTEM

(75) Inventors: Koukichi Hiroshiro, Koshi (JP); Takanori Nishi, Koshi (JP); Takahiro Kitano, Koshi (JP); Shoichi Terada, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 258 days.

(21) Appl. No.: 12/943,204

(22) Filed: Nov. 10, 2010

(65) Prior Publication Data
US 2011/0117291 A1 May 19, 2011

(30) Foreign Application Priority Data

Nov. 19, 2009 (JP) .................. 2009-263562
Nov. 19, 2009 (JP) .................. 2009-263563
Oct. 6, 2010 (JP) .................. 2010-226191

(51) Int. Cl.
*B05C 5/02* (2006.01)

(52) U.S. Cl.
USPC ............... 118/313; 118/52; 118/56; 118/319; 118/320; 118/641

(58) Field of Classification Search
USPC ............. 118/301, 641–643, 52, 56, 319, 320, 118/504, 505, 313; 101/287, 483; 134/902; 427/240

See application file for complete search history.

(56) References Cited

U.S. PATENT DOCUMENTS 6,605,153 B2 * 8/2003 Kitano et al. .................. 118/57

FOREIGN PATENT DOCUMENTS

| JP | A-H05-185436 | 7/1993 |
| JP | A-2001-269942 | 10/2001 |
| JP | A-2002-283354 | 10/2002 |
| JP | A-2008-238502 | 10/2008 |
| JP | 2009-043998 A | 2/2009 |

OTHER PUBLICATIONS

Office Action mailed Feb. 21, 2012 in corresponding JP application No. 2009-263562 (and English translation).

* cited by examiner

*Primary Examiner* — Laura Edwards
(74) *Attorney, Agent, or Firm* — Posz Law Group, PLC

(57) ABSTRACT

In a template treatment of forming a film of a release agent on a treatment surface of a template, the treatment surface of the template is first cleaned. Thereafter, in a coating unit, the release agent is applied to the treatment surface of the template. The release agent on the template is then dried. Then, alcohol is applied to the release agent on the template to make the release agent adhere to the treatment surface of the template and to remove an unreacted portion of the release agent. Thereafter, the alcohol on the template is dried and removed. In this manner, a film of the release agent is formed in a predetermined film thickness on the treatment surface of the template.

6 Claims, 25 Drawing Sheets

TEMPLATE TREATMENT METHOD, PROGRAM, COMPUTER STORAGE MEDIUM, TEMPLATE TREATMENT APPARATUS AND IMPRINT SYSTEM

BACKGROUND OF THE INVENTION

1. Field of the Invention

The present invention relates to a template treatment method of forming a film of a release agent on a template having a transfer pattern formed thereon, a program, a computer storage medium, a template treatment apparatus and an imprint system.

2. Description of the Related Art

In a manufacturing process of a semiconductor device, for example, photolithography processing is performed, for example, on a semiconductor wafer (hereinafter, referred to as a "wafer") to form a predetermined resist pattern on the wafer.

When forming the above-described resist pattern, miniaturization of the resist pattern is required in order for higher integration of the semiconductor device. Generally, the limit of miniaturization in the photolithography processing is about the wavelength of light used in exposure processing. Therefore, conventionally, the wavelength of light for use in the exposure processing has been increasingly reduced. However, there are technical and cost limits in reducing the wavelength of an exposure light source, and it is now difficult to form a fine resist pattern at a level of, for example, several nanometers only by the method of increasingly reducing the wavelength of light.

Hence, recently, it is proposed to form a fine resist pattern on the wafer using a so-called imprint method instead of performing photolithography processing on the wafer. This method is to bring a template (referred also to as a mold or a die) having a fine pattern on its front surface into press contact with the resist surface formed on the wafer and then peel off the template to thereby directly transfer the pattern to the resist surface (Japanese Patent Laid-open Publication No. 2009-43998).

SUMMARY OF THE INVENTION

On the front surface of the template for use in the above-described imprint method, generally, a film of a release agent having liquid repellency to the resist is formed in order to make the template easy to peel off from the resist.

When forming the film of the release agent on the front surface of the template, the front surface of the template is first cleaned and then the release agent is applied to the front surface of the template. In this event, the contact angle of the release agent on the template is, for example, 77 degrees to 80 degrees. Then, the release agent is made to adhere to the front surface of the template in order for the formed release agent film to have a predetermined contact angle, for example, about 110 degrees to exhibit the liquid repellent function to the resist. Specifically, the release agent is made to chemically react with the front surface of the template so that a component having liquid repellency to the resist of components contained in the release agent, for example, a fluoride component, is made to stick to the front surface of the template. Thereafter, an unreacted portion of the release agent is removed, whereby a film of the release agent in a predetermined film thickness is formed on the front surface of the template. Note that the unreacted portion of the release agent refers to a portion other than the portion of the release agent which chemically reacts with and adheres to the front surface of the template.

However, when forming a film of the release agent as described above, it takes time for the release agent on the template to adhere to the front surface of the template. For example, when the template is left to stand in an atmosphere at room temperature, it will take about 24 hours for the release agent to adhere to the template.

Hence, the inventors tried to heat and burn the release agent on the template in order to promote the chemical reaction between the release agent and the front surface of the template. In this case, the time for the release agent to adhere to the template could be reduced. For example, when the release agent was heated to 60° C., the time required for the release agent to adhere to the template was about 1 hour, and when the release agent was heated to 200° C., the time required for the release agent to adhere to the template was about 3 minutes.

In this case, however, it takes much time to cool the template which has been once heated. Accordingly, this case did not improve the throughput of the template treatment. Further, since the release agent thermally expands when the release agent is heated, the film of the release agent cannot be formed in a predetermined film thickness on the front surface of the template. Thus, when imprint processing was performed using the template having the film of the release agent formed thereon in this manner, it was difficult to form a fine pattern at a level of several nanometers on the wafer.

The present invention has been made in consideration of the above points, and its object is to improve the throughput of template treatment while appropriately forming a film of a release agent on a template.

To achieve the above object, the present invention is a template treatment method of forming a film of a release agent on a template having a transfer pattern formed thereon, the method including: a release agent treatment step of supplying the release agent to a front surface of the template; and an alcohol treatment step of thereafter supplying alcohol to the release agent on the template to improve adhesiveness between the front surface of the template and the release agent.

In the release agent treatment step, the release agent may be applied to a treatment surface of the template having the transfer pattern formed thereon, and in the alcohol treatment step, alcohol may be applied to the release agent on the template. After study, the inventors found that when alcohol was applied to the release agent on the template, chemical reaction between the treatment surface of the template and the release agent was promoted to improve adhesiveness between the treatment surface of the template and the release agent. More specifically, when alcohol is applied to the release agent, alcohol can make the release agent adhere to the treatment surface of the template in a short time and make the contact angle of the release agent film formed on the template a predetermined angle so that the release agent can exhibit its the release function. Since the release agent can be made to adhere to the treatment surface of the template in a short time as described above, the throughput of the whole template treatment can be improved. In addition, since it is unnecessary to heat the release agent in this case, unlike the prior art, the release agent never thermally expands. Accordingly, a film of the release agent can be appropriately formed in a predetermined film thickness on the treatment surface of the template.

In the release agent treatment step, a plurality of templates may be immersed in a release agent stored in a release agent bath to make the release agent adhere to front surfaces of the templates, and in the alcohol treatment step, the plurality of templates may be immersed in a liquid alcohol stored in an alcohol bath, or the plurality of templates may be exposed to a gaseous or misty alcohol. After study, the inventors found that when the template to which the release agent adhered was immersed in the liquid alcohol or the template to which the release agent adhered was exposed to the gaseous or misty alcohol, the alcohol promoted chemical reaction between the front surface of the template and the release agent to improve adhesiveness between the front surface of the template and the release agent. More specifically, alcohol can make the release agent adhere to the front surface of the template in a short time and make the contact angle of the release agent film formed on the template a predetermined angle so that the release agent can exhibit its release function. Since the release agent can be made to adhere to the front surface of the template in a short time as described above, the throughput of the whole template treatment can be improved. In addition, since it is unnecessary to heat the release agent in this case, unlike the prior art, the release agent never thermally expands. Accordingly, a film of the release agent can be appropriately formed in a predetermined film thickness on the front surface of the template. Further, according to the present invention, a plurality of templates are treated at one time, so that the throughput of the above-described template treatment can be further improved.

The present invention according to another aspect is a program running on a computer of a control unit for controlling a template treatment apparatus in order to cause the template treatment apparatus to execute a template treatment method of forming a film of a release agent on a template having a transfer pattern formed thereon, the template treatment method including: a release agent treatment step of supplying the release agent to a front surface of the template; and an alcohol treatment step of thereafter supplying alcohol to the release agent on the template to improve adhesiveness between the front surface of the template and the release agent.

The present invention according to another aspect is a computer-readable storage medium storing a program running on a computer of a control unit for controlling a template treatment apparatus in order to cause the template treatment apparatus to execute a template treatment method of forming a film of a release agent on a template having a transfer pattern formed thereon, the template treatment method including: a release agent treatment step of supplying the release agent to a front surface of the template; and an alcohol treatment step of thereafter supplying alcohol to the release agent on the template to improve adhesiveness between the front surface of the template and the release agent.

The present invention according to still another aspect is a template treatment apparatus for fanning a film of a release agent on a template having a transfer pattern formed on a treatment surface thereof, the apparatus including a coating unit, the coating unit including: a rotating and holding member for holding and rotating the template; a release agent nozzle for supplying the release agent to the treatment surface of the template; and an alcohol nozzle for supplying alcohol to the release agent on the template.

The present invention according to still another aspect is a template treatment apparatus for forming a film of a release agent on a template having a transfer pattern formed thereon, the apparatus including: a carrying arm for holding and carrying a plurality of templates; a release agent bath for storing a release agent and immersing the plurality of templates in the release agent to make the release agent adhere to front surfaces of the templates; and an alcohol treatment unit including an alcohol bath provided downstream the release agent bath for storing a liquid alcohol and immersing the plurality of templates in the liquid alcohol to improve adhesiveness between the front surfaces of the templates and the release agent, or an alcohol supplying part provided downstream the release agent bath for supplying a gaseous or misty alcohol and exposing the plurality of templates to the gaseous or misty alcohol to improve adhesiveness between the front surfaces of the templates and the release agent.

The present invention according to yet another aspect is an imprint system including a template treatment apparatus for forming a film of a release agent on a template having a transfer pattern formed on a treatment surface thereof, the system including: an imprint unit for transferring the transfer pattern to a coating film formed on a substrate using the template having the film of the release agent formed on the treatment surface in the template treatment apparatus to thereby form a predetermined pattern in the coating film, the template treatment apparatus including a coating unit, the coating unit including: a rotating and holding member for holding and rotating the template; a release agent nozzle for supplying the release agent to the treatment surface of the template; and an alcohol nozzle for supplying alcohol to the release agent on the template.

According to the present invention, the throughput of template treatment can be improved while a film of release agent is appropriately formed on a template.

DETAILED DESCRIPTION OF THE INVENTION

Figure 1:
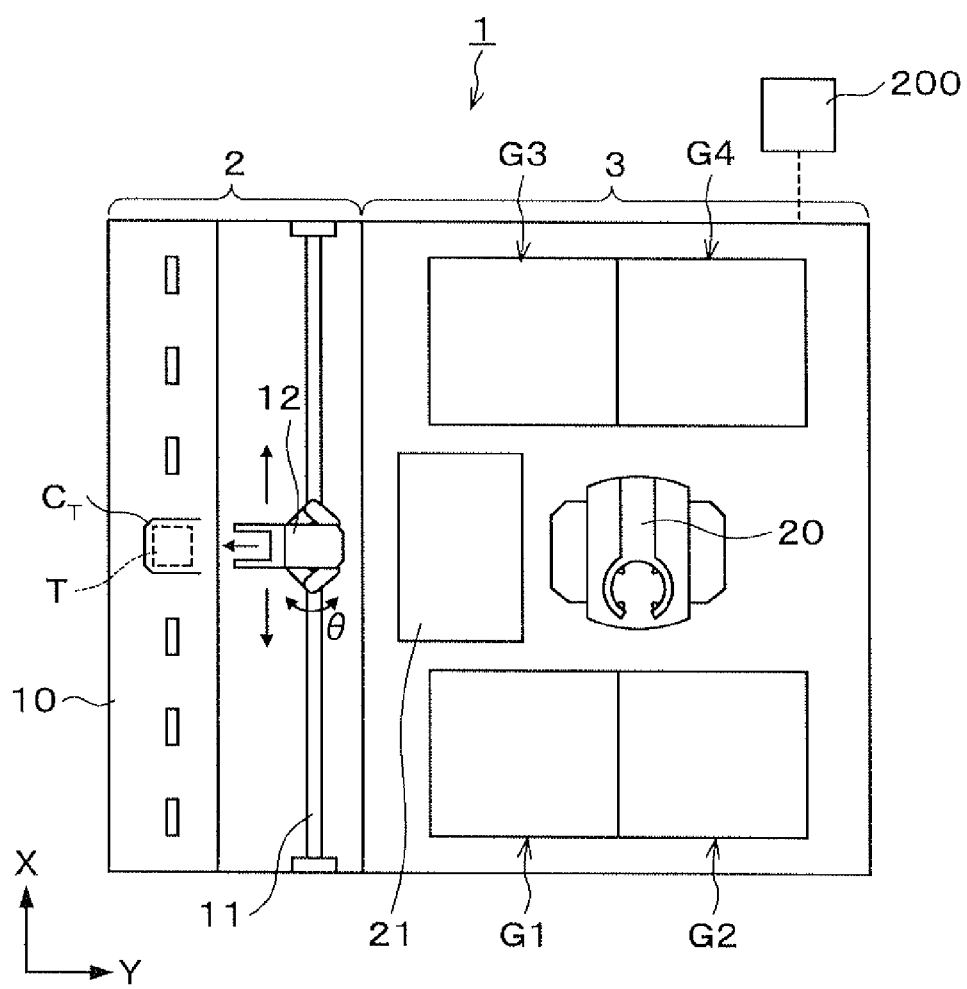
FIG. 1 is a plan view showing the outline of the configuration of a template treatment apparatus according to this embodiment.
Figure 2:
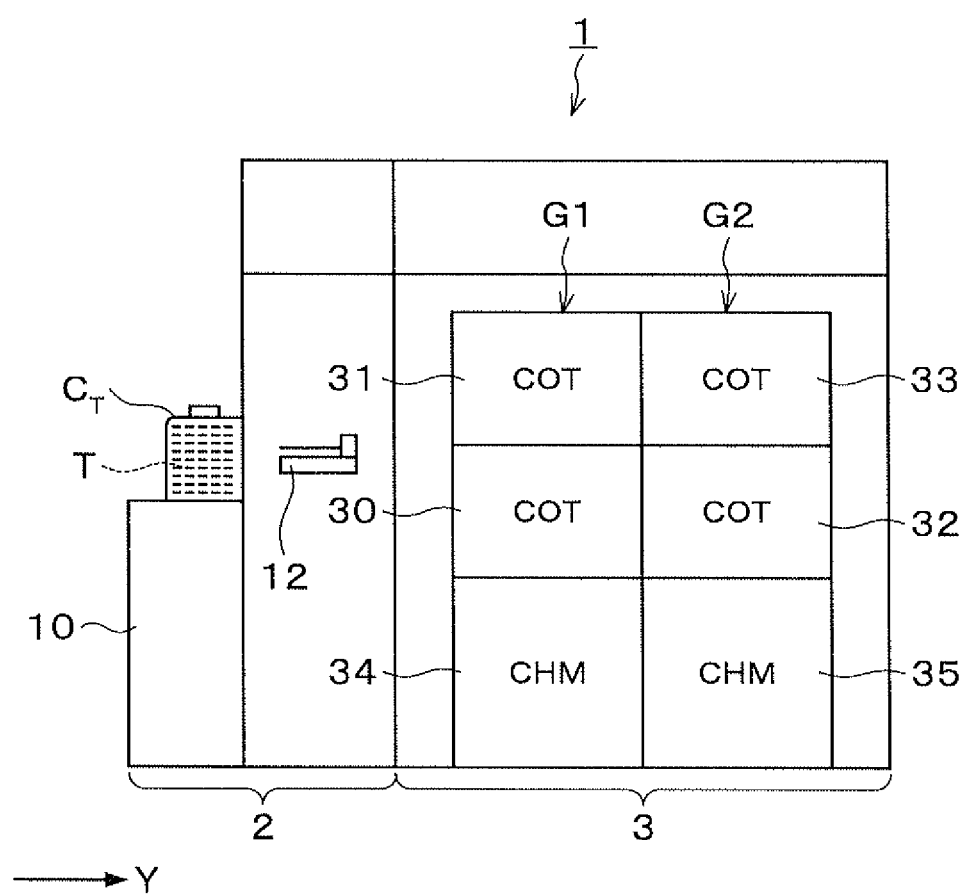
FIG. 2 is a side view showing the outline of the configuration of the template treatment apparatus according to this embodiment.
Figure 3:
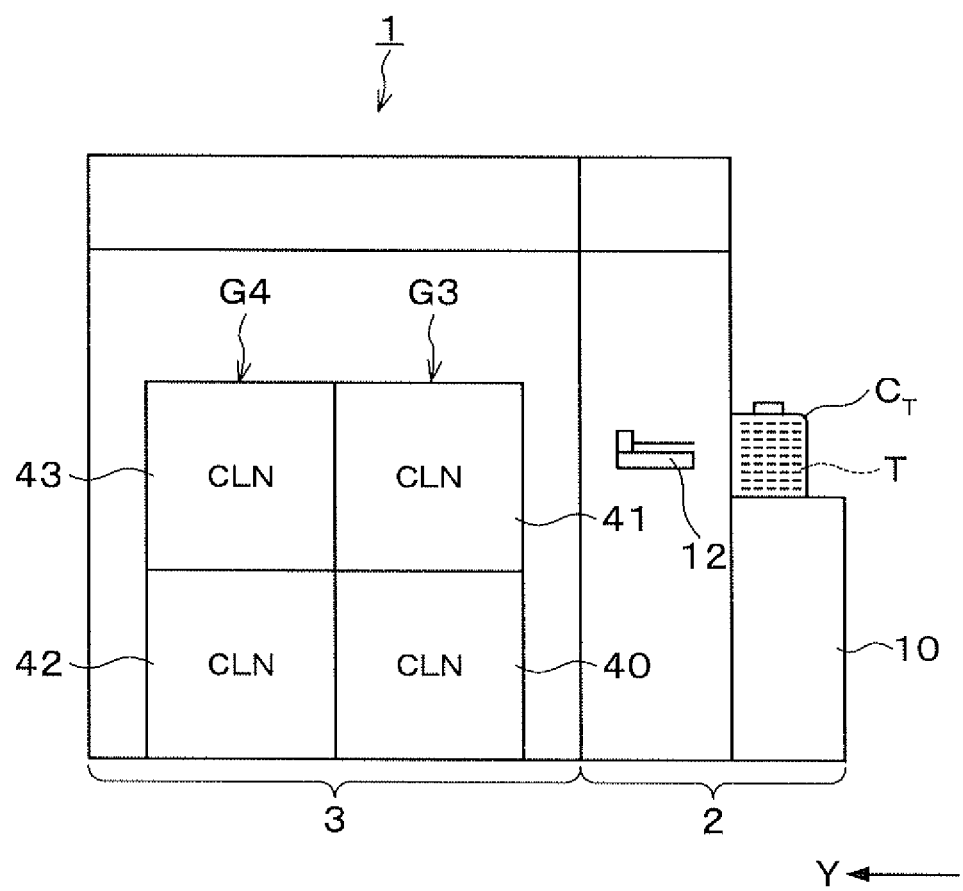
FIG. 3 is a side view showing the outline of the configuration of the template treatment apparatus according to this embodiment.
Figure 4:
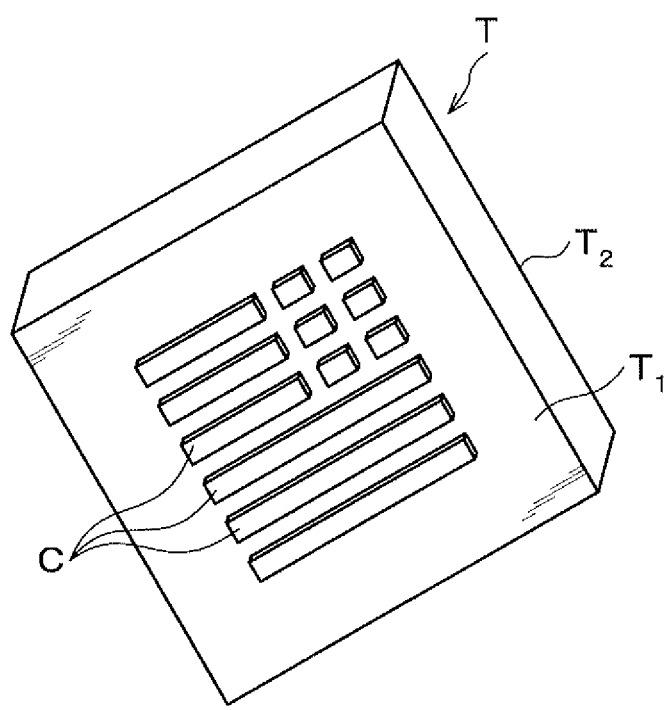
FIG. 4 is a perspective view of a template.

Hereinafter, an embodiment of the present invention will be described. FIG. 1 is a plan view showing the outline of the configuration of a template treatment apparatus 1 according to this embodiment. FIG. 2 and FIG. 3 are side views showing the outline of the configuration of the template treatment apparatus 1.

In the template treatment apparatus 1 of this embodiment, a template T which has a rectangular parallelepiped shape and a predetermined transfer pattern C formed on a treatment surface is treated. Hereinafter, the surface of the template T on which the transfer pattern C is formed is referred to as a treatment surface $T_1$ and a surface opposite the treatment surface $T_1$ is referred to as a rear surface $T_2$. Note that for the template T, a transparent material which can transmit light such as visible light, near ultraviolet light, ultraviolet light, for example, glass is used.

The template treatment apparatus 1 has, as shown in FIG. 1, the configuration in which, for example, a template carry-in/out station 2 for carrying a plurality of, for example, 5 templates T per cassette as a unit from/to the outside into/from the template treatment apparatus 1 and carrying the templates T into/out of a template cassette $C_T$; and a treatment station 3 including a plurality of treatment units for performing predetermined treatments on the templates T, are integrally connected.

In the template carry-in/out station 2, a cassette mounting table 10 is provided. The cassette mounting table 10 is configured such that a plurality of template cassettes $C_T$ can be mounted in a line in an X-direction (a top-to-bottom direction in FIG. 1). In other words, the template carry-in/out station 2 is configured to be able to keep a plurality of templates T therein.

In the template carry-in/out station 2, a template carrying body 12 is provided which is movable on a carry path 11 extending in the X-direction. The template carrying body 12 is also movable in the vertical direction and around the vertical (in a θ-direction), and thus can carry the templates T in the template cassettes $C_T$ and the treatment station 3.

At a central portion in the treatment station 3, a carry unit 20 is provided. Around the carry unit 20, for example, four treatment blocks G1 to G4 are arranged in each of which a plurality of treatment units are multi-tiered. On the front side of the treatment station 3 (an X-direction negative direction side in FIG. 1), the first treatment block G1 and the second treatment block G2 are placed in order from the template carry-in/out station 2 side. On the rear side of the treatment station 3 (an X-direction positive direction side in FIG. 1), the third treatment block G3 and the fourth treatment block G4 are placed in order from the template carry-in/out station 2 side. A transition unit 21 for passing the template T is placed on the template carry-in/out station 2 side in the treatment station 3.

The carry unit 20 has a carrying arm which holds and carries the template T and is movable in the horizontal, direction and the vertical direction and around the vertical. Thus, the carry unit 20 can carry the template T to the later-described various kinds of treatment units arranged in the treatment blocks G1 to G4 and the transition unit 21.

In the first treatment block G1, as shown in FIG. 2, a plurality of solution treatment units, for example, coating units 30, 31 each for applying a liquid release agent and alcohol to the template T are two-tiered in order from the bottom. In the second treatment block G2, coating units 32, 33 are similarly two-tiered in order from the bottom. Further, chemical chambers 34, 35 each for supplying the release agent to the coating units 30 to 33 are provided on the lowermost tiers of the first treatment block G1 and the second treatment block G2, respectively.

In the third treatment block G3, as shown in FIG. 3, cleaning units 40, 41 each for irradiating the template T with ultraviolet light to clean the treatment surface $T_1$ before a film of the release agent is formed on the template T, are two-tiered in order from the bottom.

In the fourth treatment block G4, cleaning units 42, 43 are two-tiered in order from the bottom similarly in the third treatment block G3.

Next, the configurations of the above-described coating units 30 to 33 will be described. The coating unit 30 has a treatment container 110 having a carry-in/out port (not shown) for the template T formed on its side surface as shown in FIG. 5.

Figure 6:
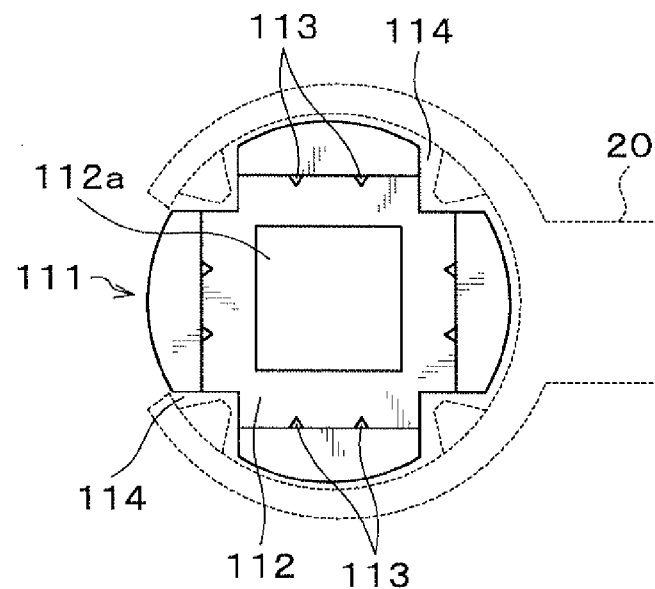
FIG. 6 is a plan view showing the outline of the configuration of a holding member.

At a central portion in the treatment container 110, a rotating and holding member 111 for holding and rotating the template T is provided. A central portion of the rotating and holding member 111 is recessed downward to form an accommodating portion 112 for accommodating the template T. At a lower portion of the accommodating portion 112, a groove portion 112a that is smaller than the outer shape of the template T is formed. Accordingly, in the accommodating portion 112, the inner peripheral portion of the lower surface of the template T is not in contact with the rotating and holding member 111 because of the groove portion 112a, but only the outer peripheral portion of the lower surface of the template T is supported by the rotating and holding member 111. The accommodating portion 112 has an almost quadrilateral planar shape fitting the outer shape of the template T as shown in FIG. 6. In the accommodating portion 112, a plurality of projecting portions 113 projecting inside from the side surfaces are provided so that the projecting portions 113 position the template T which is accommodated in the accommodating portion 112. Further, to prevent the carrying arm from interfering with the accommodating portion 112 when the template T is passed from the carrying arm of the carry unit 20 to the accommodating portion 112, cutout portions 114 are formed at four locations on the outer periphery of the accommodating portion 112.

Figure 5:
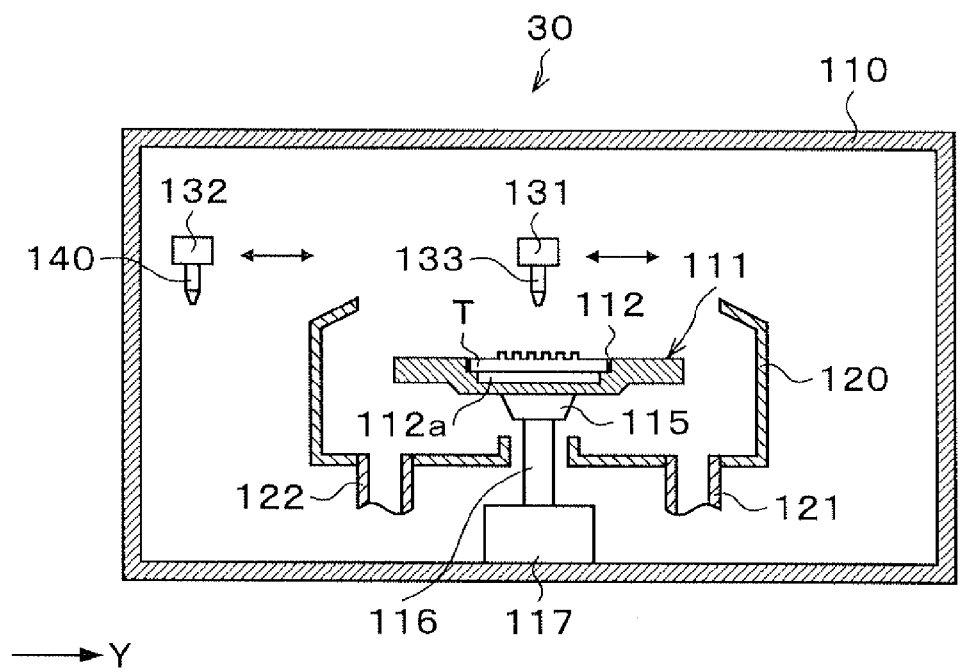
FIG. 5 is a longitudinal sectional view showing the outline of the configuration of a coating unit.

The rotating and holding member 111 is attached to a cover body 115 as shown in FIG. 5, and a rotation driving part 117 is provided below the rotating and holding member 111 via a shaft 116. By means of the rotation driving part 117, the rotating and holding member 111 can rotate at a predetermined speed around the vertical and move up and down.

Around the rotating and holding member 111, a cup 120 is provided which receives and collects the release agent splashing or dropping from the template T. A drain pipe 121 for draining the collected release agent and an exhaust pipe 122 for exhausting the atmosphere in the cup 120 are connected to the bottom surface of the cup 120.

Figure 7:
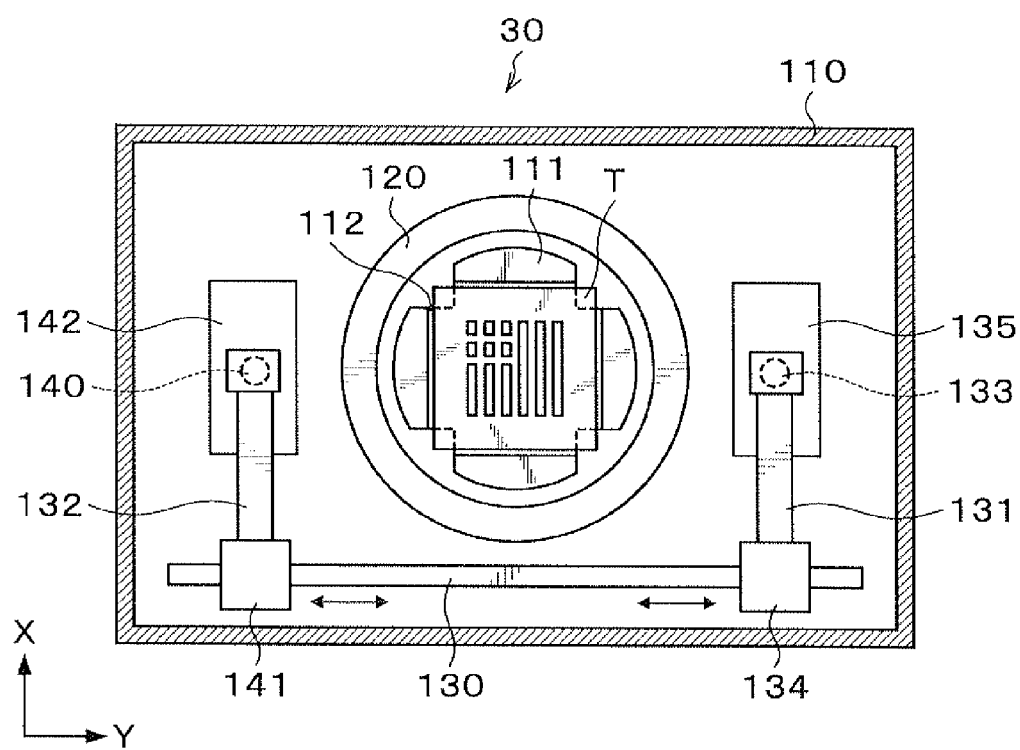
FIG. 7 is a transverse sectional view showing the outline of the configuration of the coating unit.

As shown in FIG. 7, on an X-direction negative direction (a downward direction in FIG. 7) side of the cup 120, a rail 130 extending along a Y-direction (a right-to-left direction in FIG. 7) is formed. The rail 130 is formed, for example, from a Y-direction negative direction (a left direction in FIG. 7) side outer position of the of the cup 120 to a Y-direction positive direction (a right direction in FIG. 7) side outer position. On the rail 130, for example, two arms 131, 132 are attached.

On the first arm 131, a release agent nozzle 133 for supplying the release agent onto the template T is supported. The first arm 131 is movable on the rail 130 by means of a nozzle driving part 134. Thus, the release agent nozzle 133 can move from a waiting section 135 provided at the Y-direction positive direction side outer position of the cup 120 to a position above a central portion of the template T in the cup 120. Further, the first arm 131 can freely move up and down by means of the nozzle driving part 134 to be able to adjust the height of the release agent nozzle 133. Note that as the material of the release agent, a material having liquid repellency to a later-described resist film on a wafer, for example, a fluorocarbon-based compound is used. Though the liquid release agent is used in this embodiment, a gaseous release agent may be used.

On the second arm 132, an alcohol nozzle 140 for supplying alcohol at room temperature, for example, ethanol, to the release agent on the template T is supported. The second arm 132 is movable on the rail 130 by means of a nozzle driving part 141. Thus, the alcohol nozzle 140 can move from a waiting section 142 provided at the Y-direction negative direction side outer position of the cup 120 to a position above a central portion of the template T in the cup 120. Further, the second arm 132 can freely move up and down by means of the nozzle driving part 141 to be able to adjust the height of the alcohol nozzle 140. Note that the alcohol can be any one of alcohols, and alcohol other than ethanol may be used. For example, methanol, propanol, butanol, pentanol, hexanol, heptanol may be used, or a mixture of those alcohols may be used. Further, the concentration of alcohol is not particularly limited, but a concentration of 100% is preferable. Furthermore, though alcohol at room temperature is used in this embodiment, alcohol heated, for example, at 70° C. or lower may be used in order to prevent dew condensation of alcohol. Moreover, though liquid alcohol is used in this embodiment, gaseous alcohol may be used.

Note that though the release agent nozzle 133 and the alcohol nozzle 140 are supported on separate arms 131, 132 in the above configuration, the nozzles may be supported on the same arm and movements of supply timings of the release agent nozzle 133 and the alcohol nozzle 140 may be controlled by controlling the movements of the arms. Further, a cleaning solution nozzle for jetting a cleaning solution, for example, an organic solvent may be provided inside the groove portion 112a of the rotating and holding member 111. By jetting the cleaning solution from the cleaning solution nozzle to the rear surface $T_2$ of the template T, the rear surface $T_2$ can be cleaned.

Note that the configurations of the coating units 31 and 33 are the same as that of the above-described coating unit 30, and therefore description thereof will be omitted.

Figure 8:
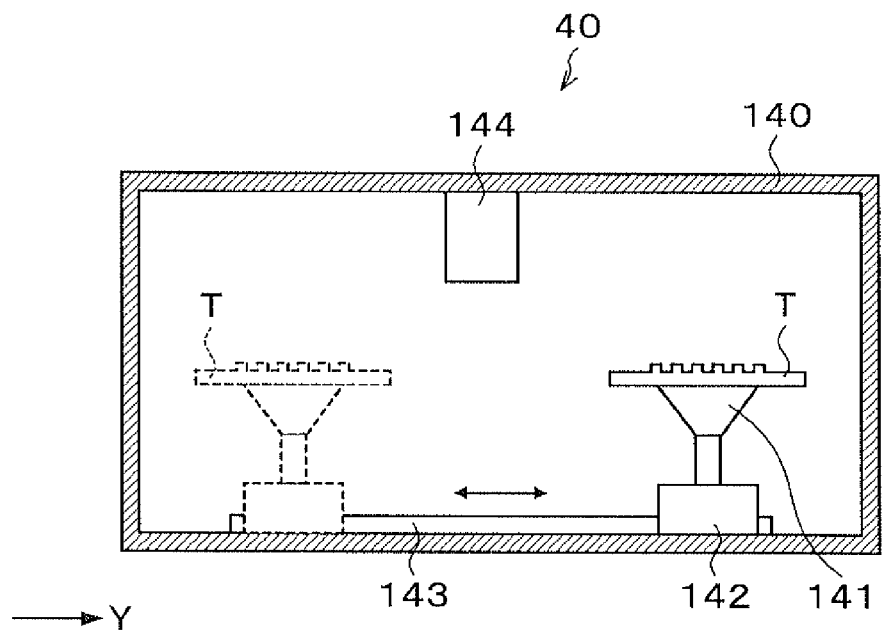
FIG. 8 is a longitudinal sectional view showing the outline of the configuration of a cleaning unit.

Next, the configurations of the above-described cleaning units 40 to 43 will be described. The cleaning unit 40 has a treatment container 140 having a carry-in/out port (not shown) for the template T formed on its side surface as shown in FIG. 8.

In the treatment container 140, a chuck 141 for suction-holding the template T is provided. The chuck 141 suction-holds the rear surface $T_2$ of the template T such that the treatment surface $T_1$ of the template T faces upward. Below the chuck 141, a chuck driving part 142 is provided. The chuck driving part 142 is attached on a rail 143 provided at the bottom surface of the treatment container 140 and extending along a Y-direction. By means of the chuck driving part 142, the chuck 141 can move along the rail 143.

Figure 9:
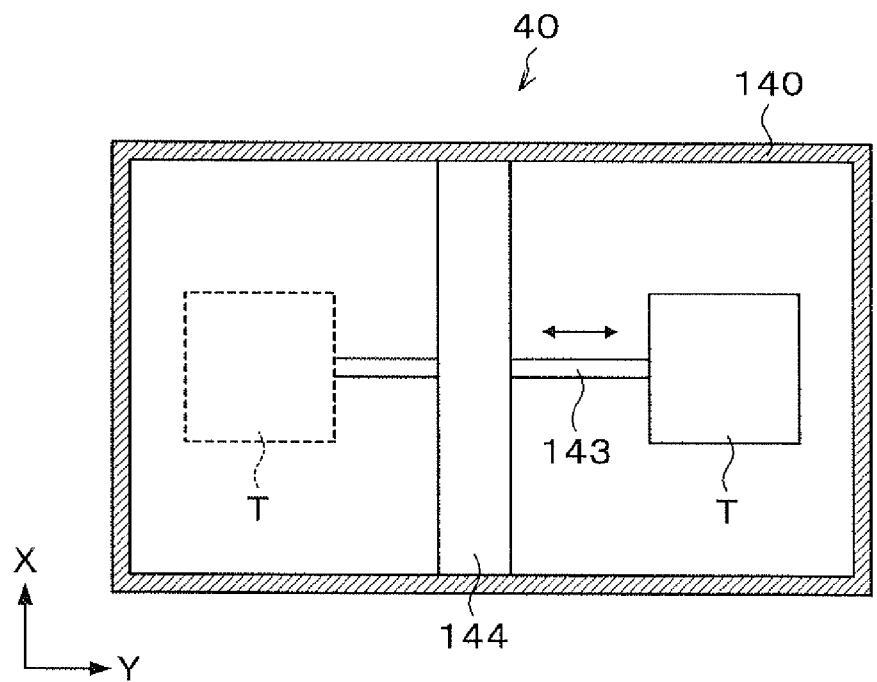
FIG. 9 is a transverse sectional view showing the outline of the configuration of the cleaning unit.

On the ceiling surface in the treatment container 140 and above the rail 143, an ultraviolet irradiating part 144 is provided which irradiates the template T held on the chuck 141 with ultraviolet light. The ultraviolet irradiating part 144 extends in an X-direction as shown in FIG. 9. The ultraviolet irradiating part 144 irradiates the treatment surface $T_1$ of the template T with ultraviolet light while the template T is moving along the rail 143, whereby the entire treatment surface $T_1$ of the template T is irradiated with the ultraviolet light.

Note that the configurations of the cleaning units 41 and 43 are the same as that of the above-described cleaning unit 40, and therefore description thereof will be omitted.

In the above template treatment apparatus 1, a control unit 200 is provided as shown in FIG. 1. The control unit 200 is, for example, a computer and has a program storage part (not shown). In the program storage part, a program is stored which controls the carry of the template T between the template carry-in/out station 2 and the treatment station 3, the operation of the drive system in the treatment station 3 and so on to thereby execute the later-described template treatment in the template treatment apparatus 1. Note that this program may be the one that is stored, for example, in a computer-readable storage medium such as a computer-readable hard disk (HD), flexible disk (FD), compact disk (CD), magneto-optical disk (MO), or memory card, and installed from the storage medium into the control unit 200.

Figure 10:
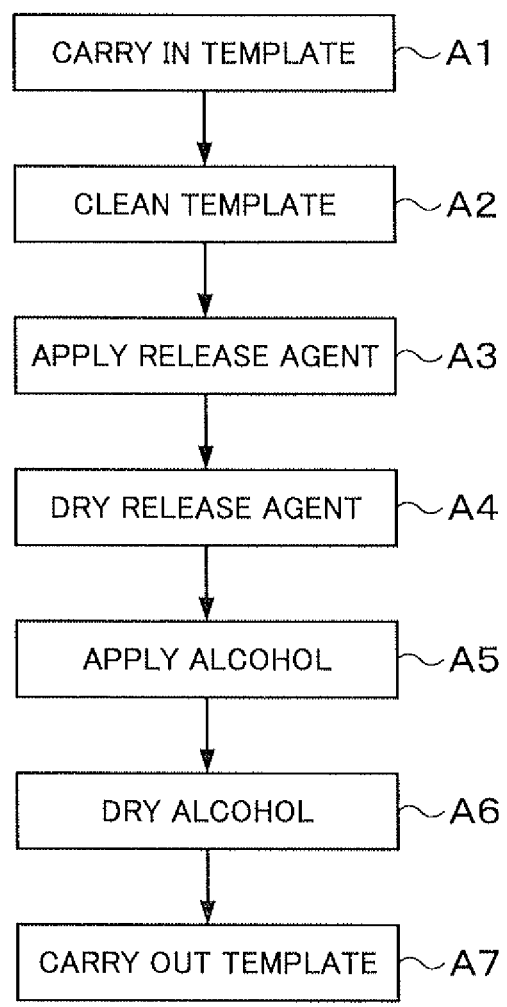
FIG. 10 is a flowchart showing steps of template treatment.

The template treatment apparatus 1 according to this embodiment is configured as described above. Next, the template treatment performed in the template treatment apparatus 1 will be described. FIG. 10 shows a main treatment flow of the template treatment, and FIGS. 11A to 11D show the states of the template T in respective steps.

First of all, a template T is taken out of the template cassette $C_T$ on the cassette mounting table 10 by the template carrying body 12 and carried to the transition unit 21 in the treatment station 3 (Step A1 in FIG. 10). In this event, the template T is housed in the template cassette $C_T$ such that the treatment surface $T_1$ having the transfer pattern C formed thereon faces upward, so that the template T in this state is carried to the transition unit 21.

Figure 11A:
FIG. 11A is an explanatory view showing the appearance where a treatment surface of the template has been cleaned.

The template T is then carried by the carry unit 20 to the cleaning unit 40 and suction-held on the chuck 141. Subsequently, the template T is irradiated with the ultraviolet light from the ultraviolet irradiating part 144 while the template T is being moved along the rail 143 by the chuck driving part 142. In this manner, ultraviolet light is applied to the entire treatment surface $T_1$ of the template T to remove impurities such as organic contaminants, particles and the like on the treatment surface $T_1$ of the template T as shown in FIG. 11A, whereby the treatment surface $T_1$ is cleaned (Step A2 in FIG. 10).

Figure 11B:
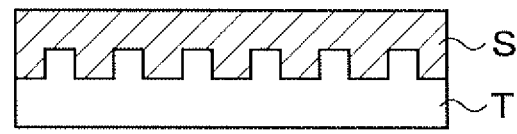
FIG. 11B is an explanatory view showing the appearance where a release agent has been applied to the treatment surface of the template.

The template T is then carried by the carry unit 20 to the coating unit 30 and passed to the rotating and holding member 111. Subsequently, the release agent nozzle 133 is moved by the first arm 131 to a position above the central portion of the template T, and the template T is rotated. The template T is rotated, for example, for 10 seconds, and the release agent is supplied onto the rotated template T and diffused over the template T by the centrifugal force. In this manner, the release agent S is applied on the entire surface $T_1$ of the template T as shown in FIG. 11B (Step A3 in FIG. 10).

Thereafter, the supply of the release agent S from the release agent nozzle 133 is stopped and the template T is further rotated, for example, for 20 seconds. By the rotation of the template T, the release agent S on the template T is dried (Step A4 in FIG. 10). While the release agent S is being dried, the release agent nozzle 133 is moved to the position above the central portion of the template T, and the alcohol nozzle 140 at the waiting section 142 is moved by the second arm 132 to a position above the central portion of the template T.

Figure 11C:
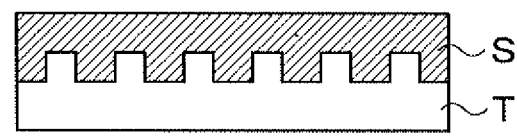
FIG. 11C is an explanatory view showing the appearance where alcohol has been applied to the release agent on the template.
Figure 11D:
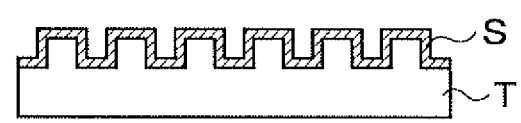
FIG. 11D is an explanatory view showing the appearance where a film of the release agent has been formed on the template.

After the release agent S on the template T is dried, the template T is continuously rotated, for example, for 10 seconds, and alcohol is supplied to the release agent S on the rotated template T. The supplied alcohol is diffused over the release agent S by the centrifugal force and thereby applied on the entire treatment surface $T_1$ of the template T (Step A5 in FIG. 10). The alcohol thus applied makes the release agent S strongly and intimately chemically react with the treatment surface $T_1$ of the template T so that the release agent S adheres to the treatment surface $T_1$ of the template T as shown in FIG. 11C. Further, after the release agent S adheres to the treatment surface $T_1$ of the template T as described above, only an unreacted portion of the release agent S, that is, only a portion other than the portion of the release agent S which chemically reacts with the treatment surface $T_1$ of the template T and adheres to the treatment surface $T_1$, is removed with the alcohol on the release agent S. In this event, since the release agent S adheres to the treatment surface $T_1$ of the template T, the release agent S within a predetermined distance from the treatment surface $T_1$ of the template T never peels off. Further, the contact angle of the release agent S on the template T is a predetermined angle, for example, 108 degrees so that the release agent S has sufficient liquid repellency to the later-described resist film and can exhibit its release function. In this manner, a film of the release agent S along the transfer pattern C is formed in a predetermined film thickness on the template T as shown in FIG. 11D.

Thereafter, the supply of alcohol from the alcohol nozzle 140 is stopped, and the template T is further rotated, for example, for 20 seconds. By the rotation of the template T, the alcohol on the template T is dried and removed (Step A6 in FIG. 10).

Thereafter, the template T is carried by the carry unit 20 to the transition unit 21, and returned by the template carrying body 12 to the template cassette $C_T$ (Step A7 in FIG. 10). Thus, a series of template treatment in the template treatment apparatus 1 ends, and the film of the release agent S along the transfer pattern C is formed in the predetermined film thickness on the treatment surface $T_1$ of the template T.

According to the above embodiment, since alcohol is applied to the release agent S on the template T in Step A5, the chemical reaction between the treatment surface $T_1$ of the template T and the release agent S is promoted, resulting in improved adhesiveness between the treatment surface $T_1$ of the template T and the release agent S. In other words, the release agent S can be made to adhere to the treatment surface $T_1$ of the template T in a short time. This can improve the throughput of the template treatment in Steps A1 to A7.

Further, after the release agent S is made to adhere to the treatment surface $T_1$ of the template T by alcohol in Step A5, only the unreacted portion of the release agent S is removed with the alcohol on the release agent S. Since the adhesiveness between the treatment surface $T_1$ of the template T and the release agent S and the removal of the unreacted portion of the release agent S are performed in the same step, the throughput of the template treatment can be further improved.

Further, since the release agent S adheres to the treatment surface $T_1$ of the template T in Step A5, the contact angle of the release agent S on the template T can be made a predetermined angle. Thus, the release agent S has sufficient liquid repellency to the resist film and can exhibit its release function.

Further, since the release agent is not heated, unlike the prior art, when the release agent S is made to adhere to the treatment surface $T_1$ of the template T in Step A5, the release agent S never thermally expands. Accordingly, a film of the release agent S can be appropriately formed in a predetermined film thickness on the treatment surface $T_1$ of the template T.

Further, since Step A4 to Step A6, that is, the application and dry of the release agent S and the application and dry of the alcohol are performed in one coating unit 30, it is unnecessary to separately provide a treatment unit which performs treatment for making the release agent S adhere to the treatment surface $T_1$ of the template T. This enables downsizing of the template treatment apparatus 1.

Further, since the treatment surface $T_1$ of the template T is cleaned in Step A2, the release agent S can be applied in the predetermined film thickness on the treatment surface $T_1$ of the template T in the subsequent Step A3. Note that this Step A2 may be omitted when the treatment surface $T_1$ of the template T has been sufficiently cleaned in advance.

Note that though the release agent S and alcohol on the template T are dried by rotating the template T in Step A4 and Step A6 in the above steps, for example, gas such an inert gas of nitrogen or dry air may be sprayed to the treatment surface $T_1$ of the template T to actively dry the release agent S and alcohol on the template T. In this case, a gas nozzle for spraying the gas to the treatment surface $T_1$ of the template T is separately provided in the coating unit 30.

Figure 12:
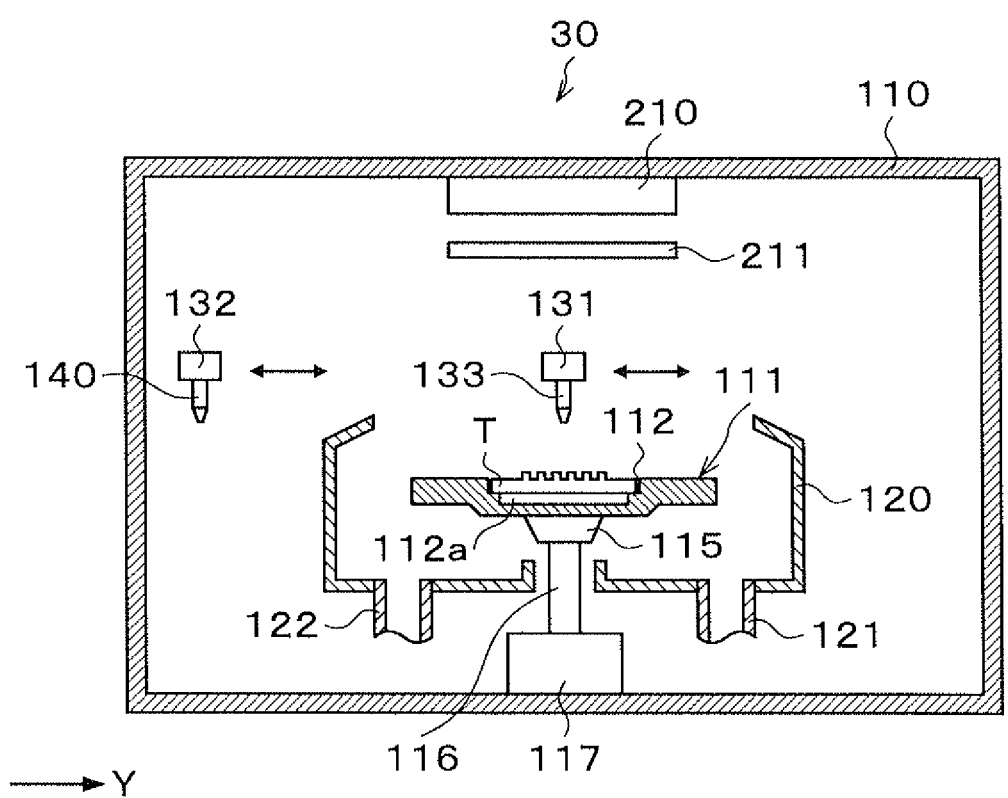
FIG. 12 is a longitudinal sectional view showing the outline of the configuration of a coating unit according to another embodiment.

In the coating unit 30 of the above embodiment, the release agent S on the template T may be irradiated with light. In this case, a light irradiating part 210 for irradiating the template T with light is provided on the ceiling surface in the treatment container 110 of the coating unit 30 and above the rotating and holding member 111 as shown in FIG. 12. The light irradiating part 210 is placed to face the treatment surface $T_1$ of the template T held on the rotating and holding member 111 and cover the entire treatment surface $T_1$. Note that for the light irradiating part 210, for example, a metal halide lamp is used.

Between the rotating and holding member 111 and the light irradiating part 210, a light filter 211 for transmitting only the light having a predetermined wavelength is placed. The light filter 211 is placed to face the treatment surface $T_1$ of the template T held on the rotating and holding member 111 and cover the entire treatment surface $T_1$. Note that the light filter 211 may be placed on a light irradiation surface of the light irradiating part 210. Further, the light irradiating part 210 and the light filter 211 may be placed obliquely above the rotating and holding member 111.

The predetermined wavelength of the light transmitted through the above-described light filter 211 is, for example, 350 nm to 2500 nm. After study, the inventors found that application of the light having the above-described wavelength to the release agent S on the template T can promote the chemical bonding between the treatment surface $T_1$ of the template T and the release agent S and improve the adhesiveness between the treatment surface $T_1$ of the template T and the release agent S. More specifically, it was found that the chemical bonding between the treatment surface $T_1$ of the template T and the release agent S by the above-described alcohol can be further promoted and the release agent S can be made to adhere to the treatment surface $T_1$ of the template T in a shorter time. It was further found that when the release agent S is irradiated with the light having a wavelength shorter than 350 nm, the release agent S may be broken to lose its release function. It was further found that when the release agent S is irradiated with the light having a wavelength longer than 2500 nm, the release agent S may be heated to thermally expand. Hence, the predetermined wavelength of light is set to 350 nm to 2500 nm in order to appropriately form the film of the release agent S in the predetermined film thickness on the treatment surface $T_1$ of the template T. Note that the light filter 211 may be formed by superposing a filter blocking light having a wavelength shorter than 350 nm on a filter blocking light having a wavelength longer than 2500 nm.

Note that the remaining configuration of the coating unit 30 is the same as that of the coating unit 30 in the above-described embodiment, and therefore description thereof will be omitted.

In this case, alcohol is applied to the release agent S on the template T and light is applied downward from the light irradiating part 210 in Step A5. Traveling of the light having the wavelength shorter than 350 nm and the light having the wavelength longer than 2500 nm of the applied light is blocked by the light filter 211. Then, only the light having the wavelength ranging from 350 nm to 2500 is transmitted through the light filter 211 and applied to the release agent S on the template T. Then, the alcohol and light promote the chemical bonding between the treatment surface $T_1$ of the template T and the release agent S to make the release agent S adhere to the treatment surface $T_1$ of the template T in a short time, for example, 5 seconds. Since the release agent S can be made to adhere to the treatment surface $T_1$ of the template T in a much shorter time as described above, the throughput of the template treatment can be further improved. Note that Steps A1 to A4 and Steps A6, A7 are the same as those in the above embodiment, and therefore description thereof will be omitted.

Though alcohol is applied to the release agent S on the template T and the release agent S is irradiated with light in Step A5 in the above embodiment, the release agent S may be irradiated with light after the alcohol on the template T is dried and removed in Step A6. Further, the release agent S may be continuously irradiated with light from Step A5 to Step A6. In either case, the release agent S can be made to adhere to the treatment surface $T_1$ of the template T in a short time.

Figure 13:
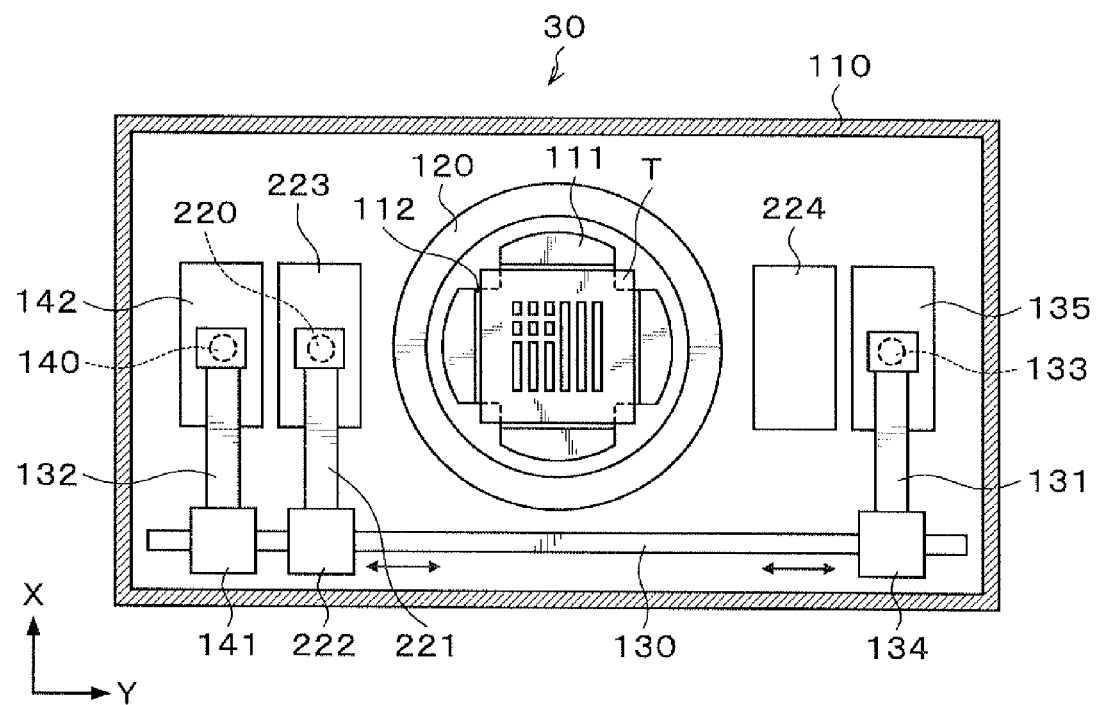
FIG. 13 is a transverse sectional view showing the outline of the configuration of the coating unit according to another embodiment.

The coating unit 30 in the above embodiment may further include a rinse solution nozzle 220 for supplying a rinse solution, for example, a solvent of the release agent S, to the release agent S on the template T as shown in FIG. 13. The rinse solution nozzle 220 is supported on a third arm 221. The third arm 221 is movable on the rail 130 by means of a nozzle driving part 222. Thus, the rinse solution nozzle 220 can move from a waiting section 223 set between the waiting section 142 and the cup 120 to a waiting section 224 set between the waiting section 135 and the cup 120 passing above the center portion of the template T in the cup 120. Further, the third arm 221 is movable up and down by means of the nozzle driving part 222 to adjust the height of the rinse solution nozzle 220. Note that the remaining configuration of the coating unit 30 is the same as that of the above-described embodiment, and therefore description thereof will be omitted. Further, the rinse solution nozzle 220 is supported on the third arm 221 in the above configuration but may be supported on the same arm together with the release agent nozzle 133 and the alcohol nozzle 140.

In this case, while the alcohol on the template T is being dried in Step A6, the alcohol nozzle 140 moves from the position above the center portion of the template T and the rinse solution nozzle 220 at the waiting section 224 moves to a position above the center portion of the template T by means of the third arm 221. Then, the rinse solution is supplied onto the rotated template T to rinse the entire treatment surface $T_1$ of the template T. After a lapse of a predetermined time, only the unreacted portion of the release agent S peels off, whereby a film of the release agent S along the transfer pattern C is formed on the template T. Then, after the supply of the rinse solution is stopped, the template T is further continuously rotated to spin-dry the treatment surface $T_1$. In this manner, the release agent S on the template T is rinsed. After completion of the rinse treatment of the release agent S, the template T is returned to the template cassette $C_T$ in Step A7. Note that Steps A1 to A7 are the same as those of the above embodiment, and therefore description thereof will be omitted. Further, though the rinse solution is dried by rotating the template T in the above configuration, for example, gas such an inert gas of nitrogen or dry air may be sprayed to the treatment surface $T_1$ of the template T to actively dry the rinse solution on the template T.

According to the above embodiment, even when the unreacted portion of the release agent S cannot be completely removed with alcohol in Step A5, the unreacted portion of the release agent S can be surely removed with the rinse solution. Accordingly, a film of the release agent S on the template T can be more surely formed in the predetermined film thickness.

Figure 14:
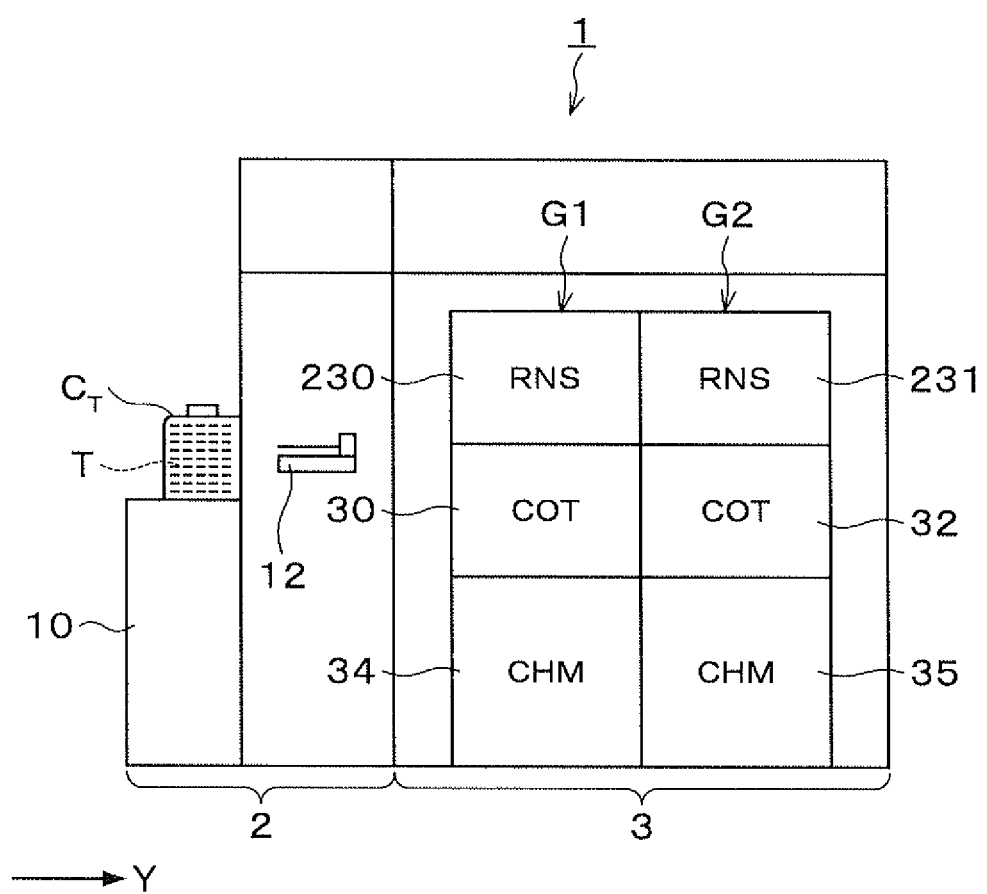
FIG. 14 is a side view showing the outline of the configuration of a template treatment apparatus according to another embodiment.

Though the rinse solution nozzle 220 is provided in the coating unit 30 in the above embodiment, a rinse unit for removing the unreacted portion of the release agent S on the template T with the rinse solution may be further provided, in place of the rinse solution nozzle 220, in the template treatment apparatus 1. In this case, a rinse unit 230 is placed, in place of the coating unit 31 shown in FIG. 2, in the first treatment block G1 as shown in FIG. 14. Similarly, a rinse unit 231 is placed, in place of the coating unit 33 also in the second treatment block G2. Further, the rinse solution is supplied from the chemical chambers 34, 35 to the rinse units 230, 231, respectively.

Figure 15:
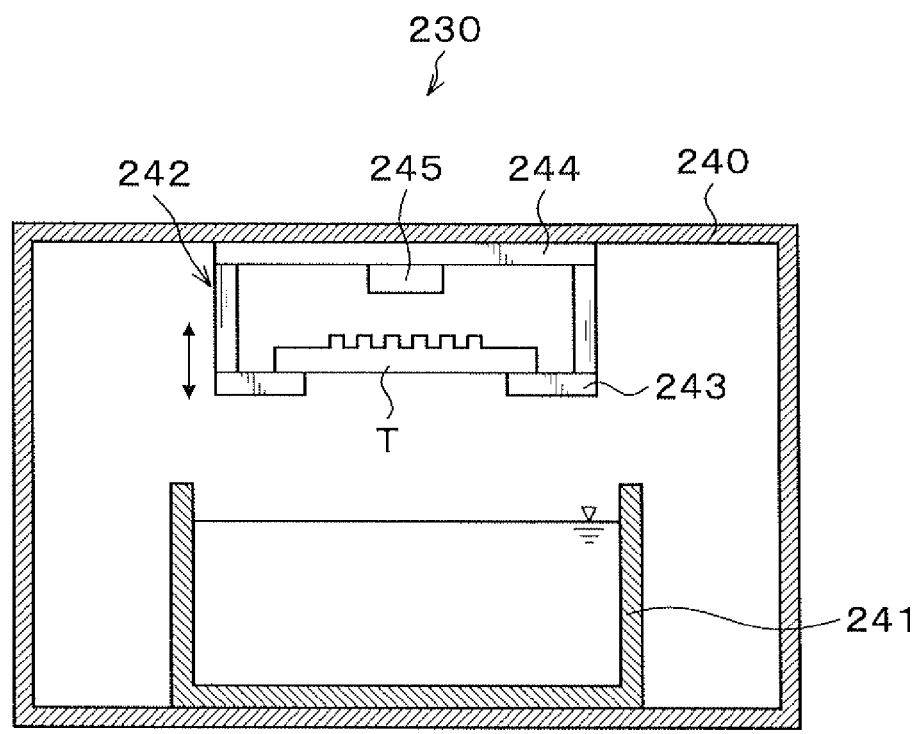
FIG. 15 is a longitudinal sectional view showing the outline of the configuration of a rinse unit.

The rinse unit 230 has a treatment container 240 having a carry-in/out port (not shown) for the template T formed on its side surface as shown in FIG. 15.

On the bottom surface of the treatment container 240, an immersion bath 241 for immersing the template T is provided. In the immersion bath 241, the rinse solution for rinsing the release agent S on the template T is stored.

On the ceiling surface in the treatment container 240 and above the immersion bath 241, a holding part 242 for holding the template T is provided. The holding part 242 has a chuck 243 for suction-holding the outer peripheral portion of the rear surface $T_2$ of the template T. The template T is held on the chuck 243 such that the treatment surface $T_1$ faces upward. The chuck 243 can move up and down by means of a raising and lowering mechanism 244. Then, the template T held on the holding part 242 is immersed in the rinse solution stored in the immersion bath 241 and the release agent S on the template T is rinsed.

The holding part 242 has a gas supplying part 245 provided above the template T held on the chuck 243. The gas supplying part 245 can spray, for example, gas such an inert gas of nitrogen or dry air downward, that is, to the treatment surface $T_1$ of the template T held on the chuck 243. Thereby, the treatment surface $T_1$ of the template T rinsed in the immersion bath 241 can be dried. Note that an exhaust pipe (not shown) for exhausting the atmosphere in the rinse unit 230 is connected to the rinse unit 230.

Note that the configuration of the rinse unit 231 is the same as that of the above-described rinse unit 230, and therefore description thereof will be omitted.

In this case, after the alcohol on the template T is dried and removed in Step A6, the template T is carried to the rinse unit 230 and held on the holding part 242. Subsequently, the holding part 242 is lowered to immerse the template T in the rinse solution stored in the immersion bath 241. After a lapse of a predetermined time, only the unreacted portion of the release agent S peels off. Thereafter, the holding part 242 is raised, and the gas is sprayed from the gas supplying part 245 to the template T to dry the treatment surface $T_1$. Upon completion of the treatment in the rinse unit 230 in this manner, the template T is returned to the template cassette $C_T$ in Step A7. Note that Steps A1 to A7 are the same as those in the above embodiment, and therefore description thereof will be omitted.

Also in the above embodiment, when the unreacted portion of the release agent S cannot be completely removed with alcohol in Step A5, the unreacted portion of the release agent S can be surely removed with the rinse solution. Accordingly, the release agent S on the template T can be more surely formed in the predetermined film thickness.

Though while the template T is being moved, ultraviolet light is applied to the moving template T in the cleaning unit 40 in the above embodiment, an ultraviolet irradiating part covering the entire treatment surface $T_1$ of the template T may be used to apply ultraviolet light to the template T similarly, for example, in the coating unit 30 shown in FIG. 12. In this case, since the entire treatment surface $T_1$ of the template T can be irradiated with ultraviolet light by one irradiation, the cleaning of the treatment surface $T_1$ of the template T can be quickly performed. Further, in this case, the template T may be rotated so that the entire treatment surface $T_1$ of the rotated template T is irradiated with ultraviolet light.

Figure 16:
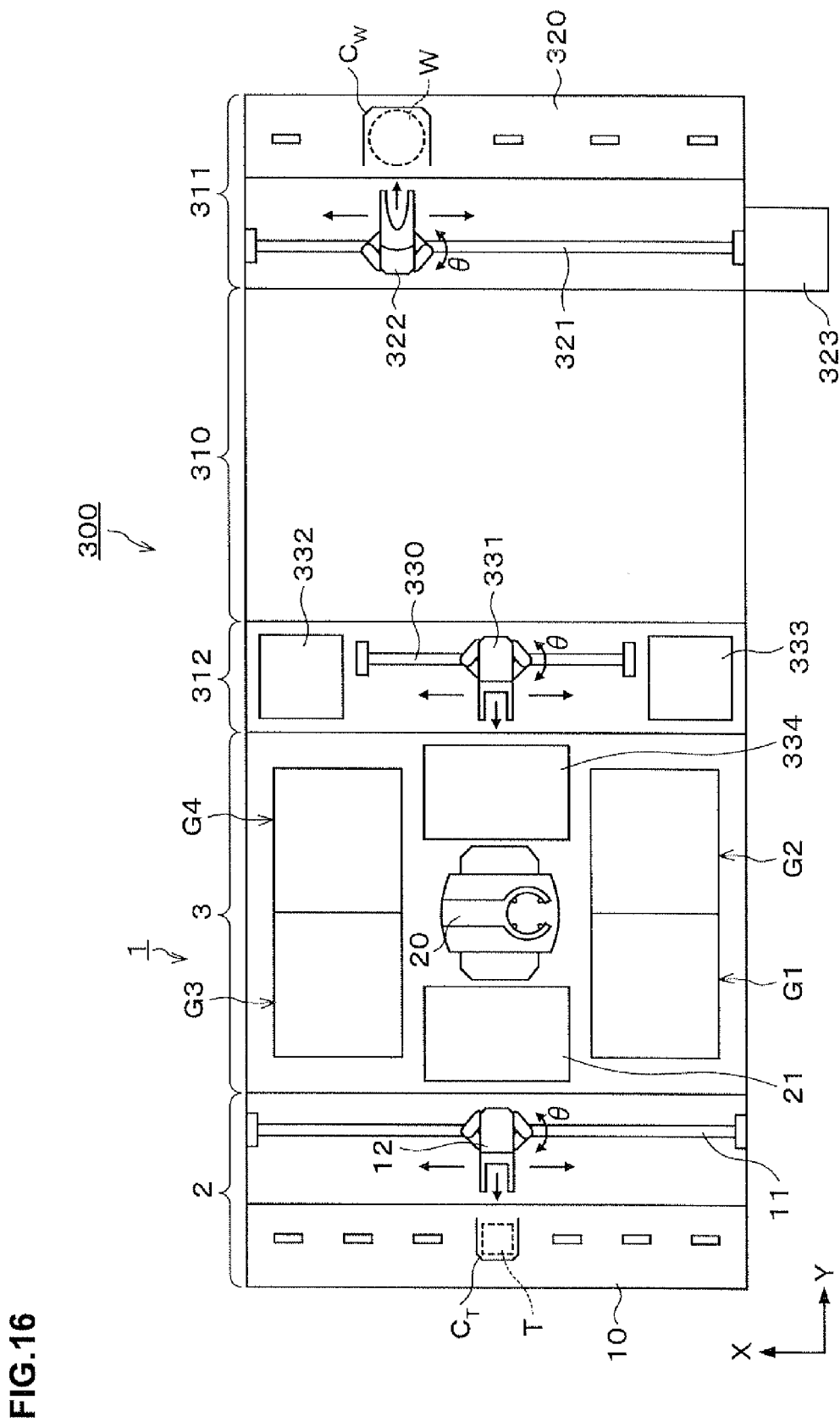
FIG. 16 is a plan view showing the outline of the configuration of an imprint system according to this embodiment.

The template treatment apparatus 1 of the above embodiment may be placed in an imprint system 300 as shown in FIG. 16. The imprint system 300 includes an imprint unit 310 for forming a resist pattern on a wafer W as a substrate using the template T, and a wafer carry-in/out station 311 for carrying a plurality of, for example, 25 wafers W per cassette as a unit from/to the outside into/from the imprint system 300 and carrying the wafers W into/out of a wafer cassette $C_W$. Further, between the template treatment apparatus 1 and the imprint unit 310, an interface station 312 for passing the template T is placed. The imprint system 300 has a configuration in which the template treatment apparatus 1, the interface station 312, the imprint unit 310 and the wafer carry-in/out station 311 are integrally connected.

In the wafer carry-in/out station 311, a cassette mounting table 320 is provided. The cassette mounting table 320 is configured such that a plurality of wafer cassettes $C_W$ can be mounted in a line in an X-direction (a top-to-bottom direction in FIG. 16). In other words, the wafer carry-in/out station 311 is configured to be able to keep a plurality of wafers W therein.

In the wafer carry-in/out station 311, a wafer carrying body 322 is provided which is movable on a carry path 321 extending in the X-direction. The wafer carrying body 322 is also movable in the vertical direction and around the vertical (in a θ-direction), and thus can carry the wafers W in the wafer cassettes $C_W$ and the imprint unit 310.

In the wafer carry-in/out station 311, an alignment unit 323 for adjusting the orientation of the wafer W is further provided. In the alignment unit 323, the orientation of the wafer W is adjusted based on, for example, the position of a notch portion of the wafer W.

In the interface station 312, a template carrying body 331 moving on a carry path 330 extending in the X-direction is provided. Further, an inversion unit 332 for inverting the front and rear surfaces of the template T is placed on the X-direction positive direction side of the carry path 330, and a buffer cassette 333 for temporarily storing a plurality of templates T is placed on the X-direction negative direction side of the carry path 330. The template carrying body 331 is movable in the vertical direction and around the vertical (in a θ-direction), and thus can carry the template T between the treatment station 3, the inversion unit 332, the buffer cassette 333, and the imprint unit 310.

In the treatment station 3 of the template treatment apparatus 1, a transition unit 334 for passing the template T is placed on the interface station 312 side of the carry unit 20.

Figure 17:
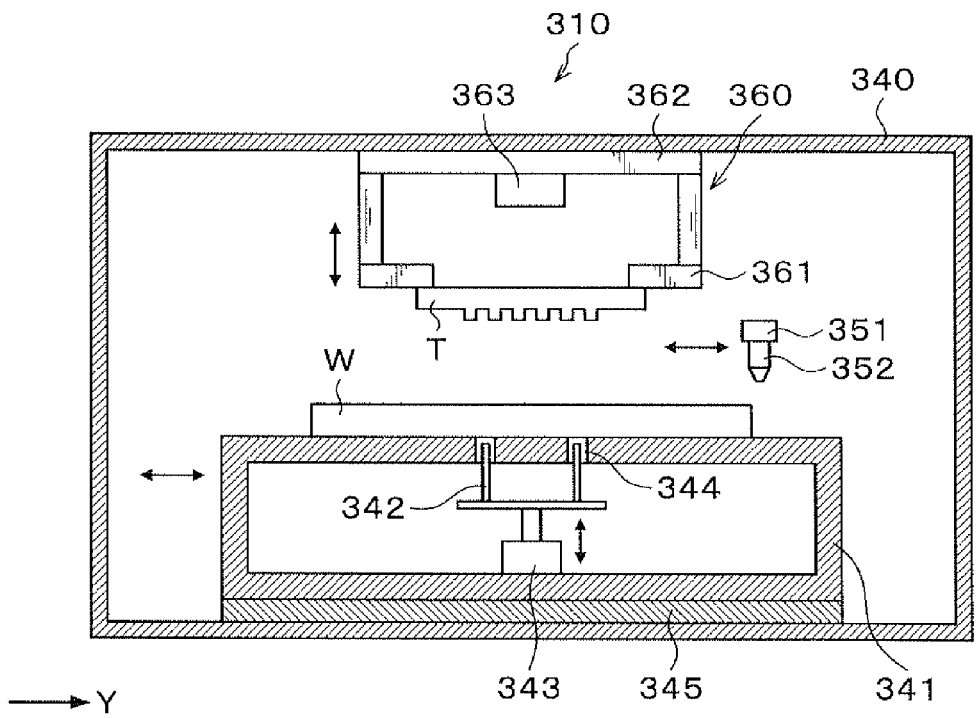
FIG. 17 is a longitudinal sectional view showing the outline of the configuration of an imprint unit.

Next, the configurations of the above-described imprint unit 310 will be described. The imprint unit 310 has a treatment container 340 having a carry-in/out port (not shown) for the template T and a carry-in/out port (not shown) for the wafer W formed on its side surfaces as shown in FIG. 17.

On the bottom surface in the treatment container 340, a wafer holding part 341 on which the wafer W will be mounted and held is provided. The wafer W is mounted on the upper surface of the wafer holding part 341 such that the surface to be processed faces upward. Inside the wafer holding part 341, raising and lowering pins 342 for supporting the wafer W from below and raising and lowering the wafer W are provided. The raising and lowering pins 342 can move up and down by means of a raising and lowering driving part 343. On the upper surface of the wafer holding part 341, through holes 344 penetrating the upper surface in the thickness direction so that the raising and lowering pins 342 are inserted into the through holes 344. Further, the wafer holding part 341 is movable in the horizontal direction and rotatable around the vertical by means of a moving mechanism 345 provided below the wafer holding part 341.

Figure 18:
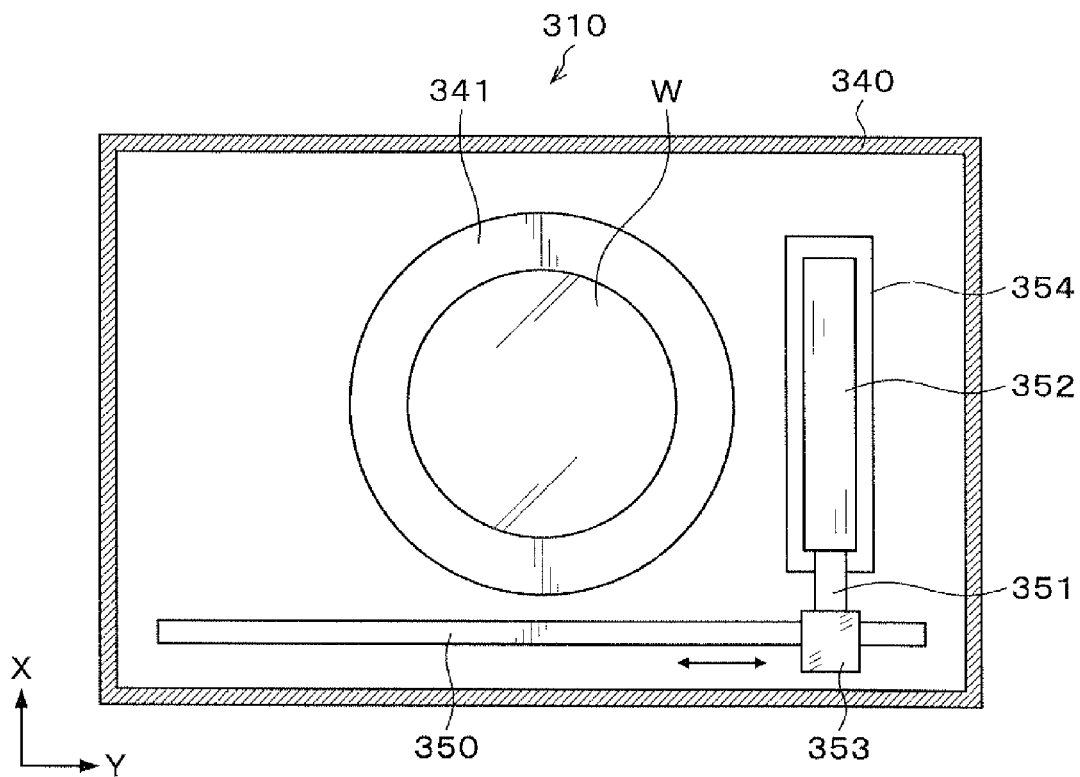
FIG. 18 is a transverse sectional view showing the outline of the configuration of the imprint unit.

As shown in FIG. 18, on an X-direction negative direction (a downward direction in FIG. 18) side of the wafer holding part 341, a rail 350 extending along a Y-direction (a right-to-left direction in FIG. 18) is formed. The rail 350 is formed, for example, from a Y-direction negative direction (a left direction in FIG. 18) side outer position of the wafer holding part 341 to a Y-direction positive direction (a right direction in FIG. 18) side outer position. On the rail 350, for example, an arm 351 is attached.

On the arm 351, a resist solution nozzle 352 for supplying the resist solution onto the wafer W is supported. The resist solution nozzle 352 has an elongated shape along the X-direction having, for example, the same size as the diameter dimension of the wafer W or longer than that. For the resist solution nozzle 352, for example, an ink-jet type nozzle is used, and a plurality of supply ports (not shown) formed in a line along the longitudinal direction are formed at a lower portion of the resist solution nozzle 352. The supply timing of the resist solution, the supply amount of the resist solution and so on of the resist solution nozzle 352 can be precisely controlled.

The arm 351 is movable on the rail 350 by means of a nozzle driving part 353. Thus, the resist solution nozzle 352 can move from a waiting section 354 provided at the Y-direction positive direction side outer position of the wafer holding part 341 to a position above the wafer W on the wafer holding part 341 and further move in the radial direction of the wafer W above the front surface of the wafer W. Further, the arm 351 is movable up and down by means of the nozzle driving part 353 to be able to adjust the height of the resist solution nozzle 352.

On the ceiling surface in the treatment container 340 and above the wafer holding part 341, a template holding part 360 for holding the template T is provided as shown in FIG. 17. More specifically, the wafer holding part 341 and the template holding part 360 are arranged such that the wafer W mounted on the wafer holding part 341 faces the template T held on the template holding part 360. Further, the template holding part 360 has a chuck 361 for suction-holding the outer peripheral portion of the rear surface $T_2$ of the template T. The chuck 361 is movable in the vertical direction and rotatable around the vertical by means of a moving mechanism 362 provided above the chuck 361. Thus, the template T can rotate and move up and down in a predetermined direction with respect to the wafer W on the wafer holding part 341.

The template holding part 360 has a light source 363 provided above the template T held on the chuck 361. From the light source 363, light such as visible light, near ultraviolet light, ultraviolet light is emitted, and the light from the light source 363 is transmitted through the template T and applied downward.

Figure 19:
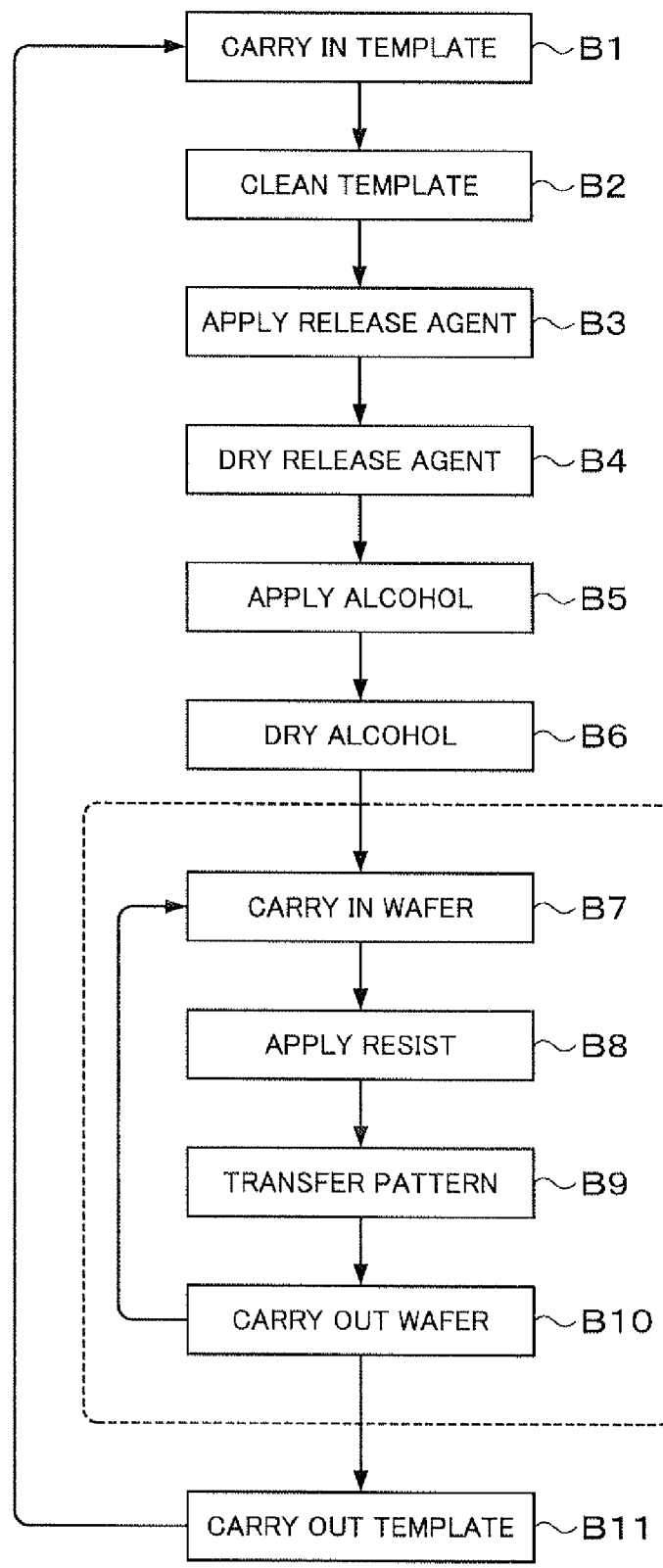
FIG. 19 is a flowchart showing steps of imprint processing.

The imprint system 300 according to this embodiment is configured as described above. Next, the imprint processing performed in the imprint system 300 will be described. FIG. 19 shows the main processing flow of the imprint processing, and FIGS. 20A to 20D show the states of the template T and the wafer W in the respective steps of the imprint processing.

First of all, a template T is carried by the template carrying body 12 from the template carry-in/out station 2 to the treatment station 3 (Step B1 in FIG. 19). In the treatment station 3, cleaning of the treatment surface $T_1$ of the template T (Step B2 in FIG. 19), application of the release agent S to the treatment surface $T_1$ (Step B3 in FIG. 19), drying of the release agent S (Step B4 in FIG. 19), application of alcohol to the release agent S on the template T (Step B5 in FIG. 19), and drying and removal of the alcohol (Step B6 in FIG. 19) are sequentially performed, whereby a film of the release agent S is formed on the treatment surface $T_1$ of the template T. Note that Steps B2 to B6 are the same as Steps A2 to A6 in the above embodiment, and therefore detailed description thereof will be omitted.

The template T on which the film of the release agent S has been formed is carried to the transition unit 334. The template T is subsequently carried by the template carrying body 331 of the interface station 312 to the inversion unit 332 and the front and rear surfaces of the template T are inverted. In other words, the rear surface $T_2$ of the template T is made to face upward. Thereafter, the template T is carried by the template carrying body 331 to the imprint unit 310 and suction-held on the chuck 361 of the template holding part 360.

In this manner, the predetermined treatment is performed on the template T in the treatment station 3. During carry of the template T to the imprint unit 310, the wafer W is taken out of the wafer cassette $C_W$ on the cassette mounting table 320 and carried to the alignment unit 323 by the wafer carrying body 322 in the wafer carry-in/out station 311. Then, in the alignment unit 323, the orientation of the wafer W is adjusted based on the position of the notch portion of the wafer W. Thereafter, the wafer W is carried by the wafer carrying body 322 to the imprint unit 310 (Step B7 in FIG. 19). Note that in the wafer carry-in/out station 311, the wafer W in the wafer cassette $C_W$ is housed such that the surface to be processed faces upward, so that the wafer W in this state is carried to the imprint unit 310.

Figure 20A:
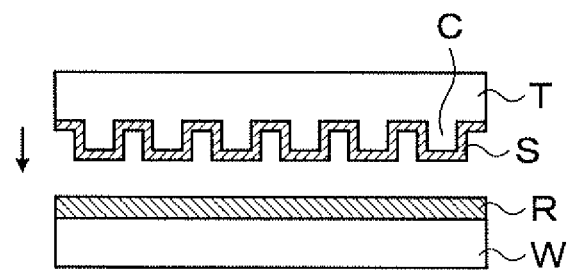
FIG. 20A is an explanatory view showing the appearance where a resist solution has been applied on a wafer.

The wafer W carried into the imprint unit 310 is passed to the raising and lowering pins 342 and mounted and held on the wafer holding part 341. Subsequently, the wafer W held on the wafer holding part 341 is moved to a predetermined position in the horizontal direction and aligned, and thereafter the resist solution nozzle 352 is moved in the radial direction of the wafer W and applies the resist solution onto the wafer W as shown in FIG. 20A, whereby a resist film R as a coating film is formed (Step B8 in FIG. 19). In this event, the control unit 200 controls the supply timing, the supply amount and so on of the resist solution to be supplied from the resist solution nozzle 352. More specifically, the resist solution is applied such that the amount of the resist solution to be applied to a portion corresponding to a protruding portion in the resist pattern to be formed on the wafer W (a portion corresponding to a recessed portion in the transfer pattern C of the template T) is large, while the amount of the resist solution to be applied to a portion corresponding to a recessed portion in the resist pattern (a portion corresponding to a protruding portion in the transfer pattern C) is small. The resist solution is applied onto the wafer W according to the aperture ratio of the transfer pattern C as described above.

Figure 20B:
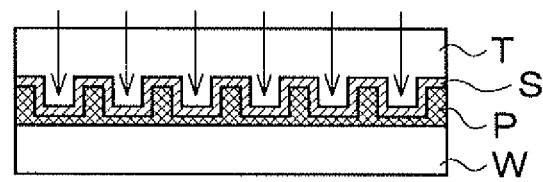
FIG. 20B is an explanatory view showing the appearance where photo polymerization of the resist film on the wafer has taken place.

Upon formation of the resist film R on the wafer W, the wafer W held on the wafer holding part 341 is moved to a predetermined position in the horizontal direction to be aligned, and the template T held on the template holding part 360 is rotated in a predetermined orientation. The template T is then moved down toward the wafer W as shown by an arrow in FIG. 20A. The template T is moved down to a predetermined position, and the treatment surface $T_1$ of the template T is pressed against the resist film R on the wafer W. Note that the predetermined position is set based on the height of the resist pattern to be formed on the wafer W. Subsequently, light is applied from the light source 363. The light from the light source 363 is transmitted through the template T and applied to the resist film R on the wafer W as shown in FIG. 20B, whereby photo polymerization of the resist film R takes place. In this manner, the transfer pattern C of the template T is transferred to the resist film R on the wafer W, whereby a resist pattern P is formed (Step B9 in FIG. 19).

Figure 20C:
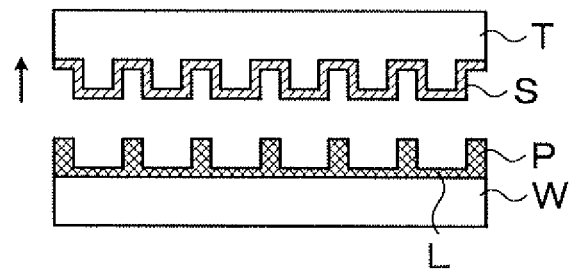
FIG. 20C is an explanatory view showing the appearance where a resist pattern has been formed on the wafer.
Figure 20D:
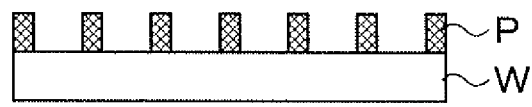
FIG. 20D is an explanatory view showing the appearance where a residual film on the wafer has been removed.

Thereafter, the template T is moved up as shown in FIG. 20C, whereby the resist pattern P is formed on the wafer W. In this event, since the release agent S has been applied on the treatment surface $T_1$ of the template T, the resist on the wafer W never adheres to the treatment surface $T_1$ of the template T. Thereafter, the wafer W is passed to the wafer carrying body 322 by the raising and lowering pins 342, and carried from the imprint unit 310 to the wafer carry-in/out station 311 and returned to the wafer cassette $C_W$ (Step B10 in FIG. 19). Note that a thin residual film L of resist can remain in the recessed portion of the resist pattern P formed on the wafer W, and the residual film L may be removed, for example, outside the imprint system 300 as shown in FIG. 20D.

By repeatedly performing the above-described Steps B7 to B10 (a part surrounded by a dotted line in FIG. 19), resist patterns P are formed on a plurality of wafers W using one template T. During this time, the above-described Steps B1 to B6 are repeatedly performed to form films of the release agent S on the treatment surfaces $T_1$ of a plurality of templates T. The templates T on which films of the release agent S have been formed are stored in the buffer cassette 333 of the interface station 312.

Then, after Steps B7 to B10 are performed on a predetermined number of wafers W, the used template T is carried out of the imprint unit 310 by the template carrying body 331, and carried to the inversion unit 332 (Step B11 in FIG. 19). Subsequently, the template T in the buffer cassette 333 is carried into the imprint unit 310 by the template carrying body 331. Thus, the template T in the imprint unit 310 is changed with another. Note that the timing of changing the template T is set in consideration of the deterioration and so on of the template T. Further, also when a different pattern P is formed on the wafer W, the template T is changed with another. The template T may be changed, for example, every time the template T is used once. Alternatively, the template T may be changed for every wafer W, or the template T may be changed for each lot.

The front and rear surfaces of the used template T carried to the inversion unit 332 are inverted. Thereafter, the template T is returned to the template cassette $C_T$ by the template carrying body 331, the carry unit 20, and the template carrying body 12. In this manner, predetermined resist patterns P are sequentially formed on a plurality of wafers W while the template T is consecutively changed with another.

The imprint system 300 in the above embodiment has the template treatment apparatus 1 and therefore can sequentially supply the templates T to the imprint unit 310 while forming films of the release agent S on the templates T in the imprint system 300. Thus, before the template T is deteriorated, or even when different resist patterns P are formed on a plurality of wafers W, the template T in the imprint unit 310 can be consecutively and efficiently changed with another. Accordingly, predetermined patterns P can be sequentially formed on a plurality of wafers W. This also makes it possible to realize mass production of semiconductor devices.

Figure 21:
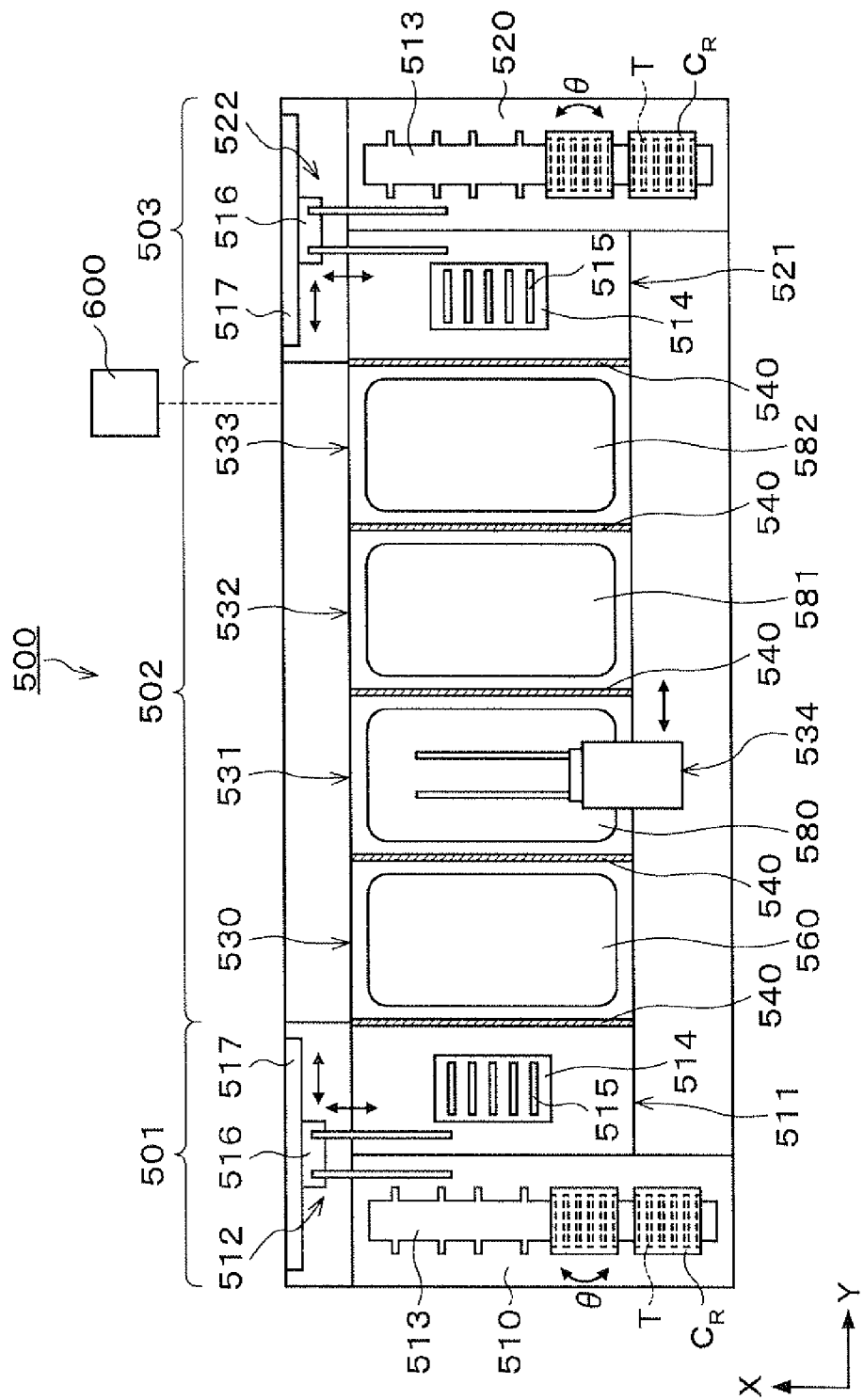
FIG. 21 is a plan view showing the outline of the configuration of a template treatment apparatus according to another embodiment.
Figure 22:
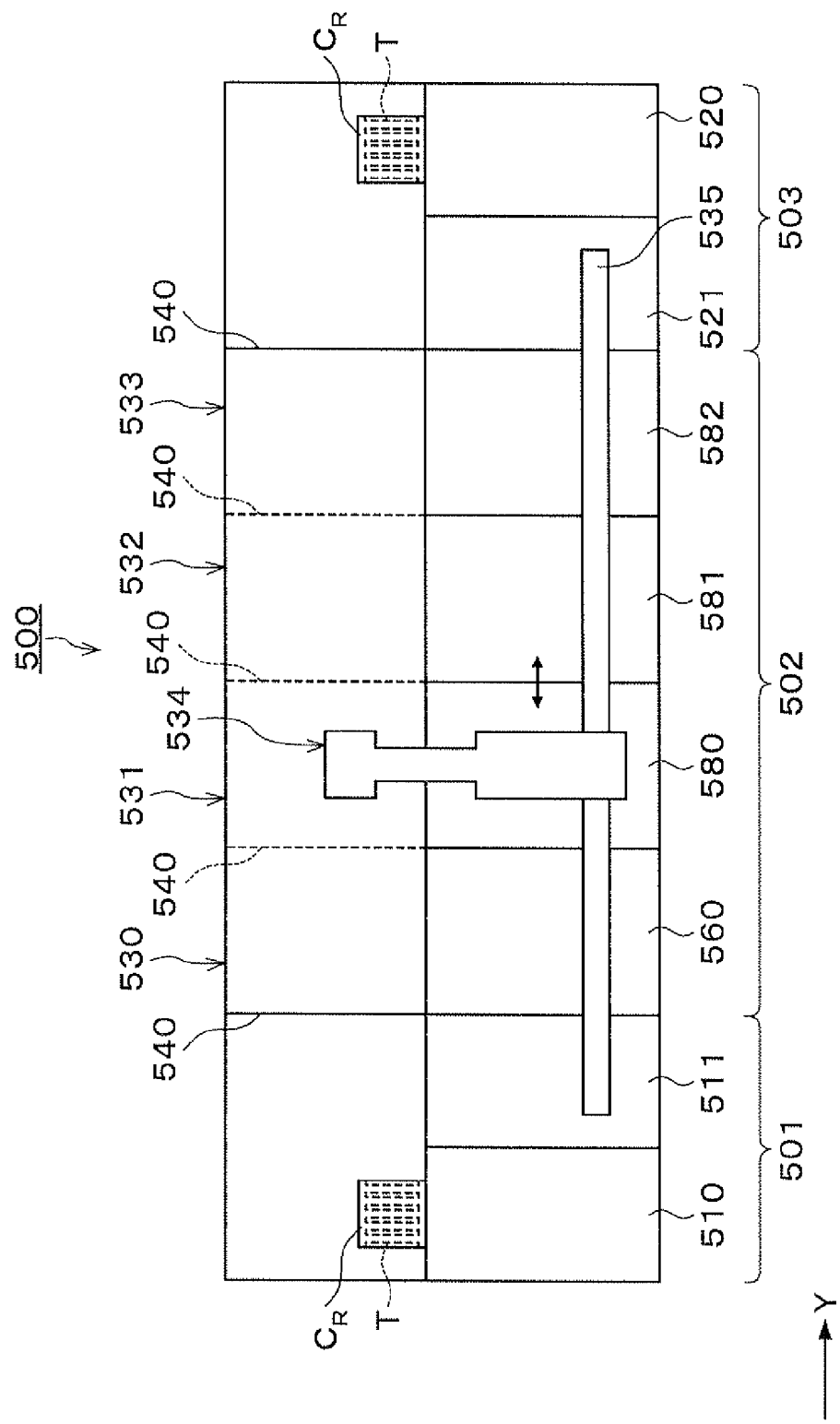
FIG. 22 is a side view showing the outline of the configuration of the template treatment apparatus according to another embodiment.

Next, another embodiment of the present invention will be described. FIG. 21 is a plan view showing the outline of the configuration of a template treatment apparatus 500 according to another embodiment. FIG. 22 is a side view showing the outline of the configuration of the template treatment apparatus 500.

Also in the template treatment apparatus 500 of this embodiment, the template T shown in FIG. 3 is treated.

The template treatment apparatus 500 is configured to consistently perform carry-in of the template T, treatment of the template T, and carry-out of the template T in a batch mode. The template treatment apparatus 500 has, as shown in FIG. 21, a configuration in which, for example, a carry-in station 501 for carrying a plurality of, for example, 5 templates T per carrier as a unit from the outside into the template treatment apparatus 500 and taking untreated templates T out of a carrier $C_R$; a treatment station 502 including a plurality of treatment units for performing predetermined treatments on the templates T; and a carry-out station 503 for housing treated templates T into the carrier $C_R$ and carrying the templates T per carrier as a unit from the template treatment apparatus 500 to the outside, are integrally connected. Note that the carry-in station 501 and the carry-out station 503 may be united to provide a carry-in/out station for performing both carry-in and carry-out of the templates T.

In the early-in station 501, a carrier mounting table 510 for mounting the carrier $C_R$ thereon, a loader 511 for taking the untreated template T out of the carrier $C_R$, and a transport unit 512 for transporting the carrier $C_R$ from the carrier mounting table 510 to the loader 511, are provided. The loader 511 is placed on the downstream side, that is, on a Y-direction positive direction side (a right direction side in FIG. 21) of the carrier mounting table 510. Further, the transport unit 512 is placed on an X-direction positive direction side (an upward direction side in FIG. 21) of the carrier mounting table 510 and the loader 511.

In the upper surface of the carrier mounting table 510, an opening portion 513 is formed extending in an X-direction (a top-to-bottom direction in FIG. 21). The periphery of the lower surface of the carrier $C_R$ is mounted on the peripheral portion of the opening portion 513, so that a plurality of carriers $C_R$ are mounted at predetermined positions on the carrier mounting table 510. Inside the carrier mounting table 510, a carrier carry unit (not shown) is provided. By the carrier carry unit, the carrier $C_R$ can be moved along the opening portion 513. Further, the carrier $C_R$ is rotatable around the vertical (in a θ-direction) and moving up and down by the carrier carry unit. In the carrier $C_R$ on the carrier mounting table 510, a plurality of, for example, 5 templates T are housed in the vertically standing positions in parallel. Note that, for example, another carrier mounting table for turning the carrier $C_R$ by 90 degrees to change the positions of the templates T in the carrier $C_R$ from the horizontal positions to the vertical positions may be provided in the carry-in station 501.

In the loader 511, a holding part 514 for taking out the plurality of templates T in the carrier $C_R$ and holding the templates T is provided. The holding part 514 is configured to be movable up and down by means of a raising and lowering mechanism (not shown) provided below the holding part 514. Further, in the holding part 514, holding grooves 515 for inserting and holding the templates T therein are formed, for example, at five locations at predetermined intervals. The intervals of the holding grooves 515 are the same as the intervals of holding grooves 553 of a later-described carrying arm 550. Accordingly, the holding part 514 can align the plurality of templates T in the vertical positions so that the carrying arm 550 can appropriately hold the plurality of templates T.

The transport unit 512 has a transport arm 516 including a pair of arms configured to freely approach and depart and freely expand and contract. The transport arm 516 can hold and transport the carrier $C_R$ by the pair of arms. The transport arm 516 is configured to be movable along a rail 517 extending in a Y-direction (a right-to-left direction in FIG. 21) and movable up and down.

Further, the carry-out station 503 has the similar configuration to that of the carry-in station 501. More specifically, in the carry-out station 503, a carrier mounting table 520 for mounting the carrier $C_R$ thereon, an unloader 521 for housing the treated template T into the carrier $C_R$, and a transport unit 522 for transporting the carrier $C_R$ from the unloader 521 to the carrier mounting table 520, are provided. The unloader 521 is placed on the upstream side, that is, on a Y-direction negative direction side of the carrier mounting table 520. Further, the transport unit 522 is placed on an X-direction positive direction side of the unloader 521 and the carrier mounting table 520. Note that the configurations of the carrier mounting table 520, the unloader 521 and the transport unit 522 are the same as those of the carrier mounting table 510, the loader 511 and the transport unit 512 in the carry-in station 501, and therefore the description thereof will be omitted.

In the treatment station 502, cleaning units 530, 531 each for cleaning the front surface of the template T, a release agent treatment unit 532 for performing release agent treatment on the front surface of the template T, and an alcohol treatment unit 533 for performing alcohol treatment on the front surface of the template T are arranged in one line in sequence from the upstream side, that is, from the carry-in station 501 side. Note that acid cleaning is performed in the cleaning unit 530 and rinse cleaning is performed in the cleaning unit 531, following the common cleaning process.

Further, on an X-direction negative direction side of the cleaning units 530, 531, the release agent treatment unit 532 and the alcohol treatment unit 533, a early unit 534 for holding and carrying a plurality of templates T is provided. The carry unit 534 can move along a rail 535 extending in a Y-direction (a right-to-left direction in FIG. 22) between the loader 511 and the unloader 521 as shown in FIG. 22. More specifically, the carry unit 534 can carry a plurality of templates T to the loader 511, the treatment units 530 to 533, and the unloader 521. Note that the rail 535 is provided on the side surfaces of the loader 511, the treatment units 530 to 533, and the unloader 521 in the shown example but may be provided, for example, on the bottom surface of the template treatment apparatus 500.

Between the loader 511 and the cleaning unit 530, a shutter 540 that freely opens and closes is provided as shown in FIG. 21. Similarly, between the cleaning units 530 and 531, between the cleaning unit 531 and the release agent treatment unit 532, between the release agent treatment unit 532 and the alcohol treatment unit 533, and between the alcohol treatment unit 533 and the unloader 521, shutters 540 are provided respectively. The shutters 540 can shut the atmospheres in the treatment units 530 to 533.

Figure 23:
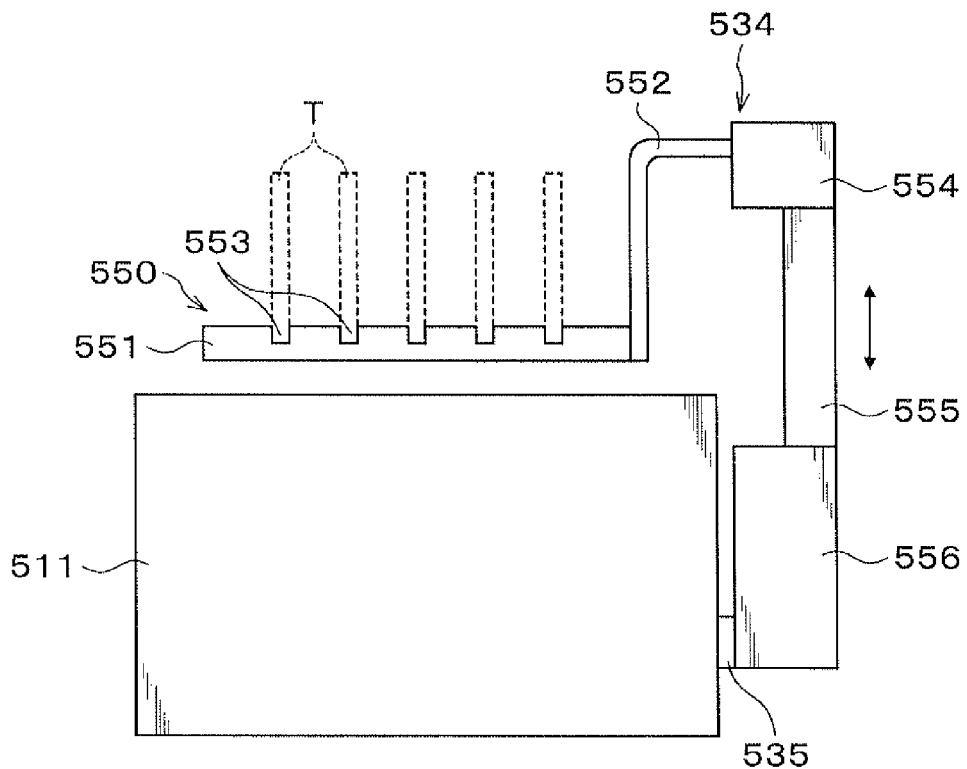
FIG. 23 is a side view showing the outline of the configuration of a carry unit.
Figure 24:
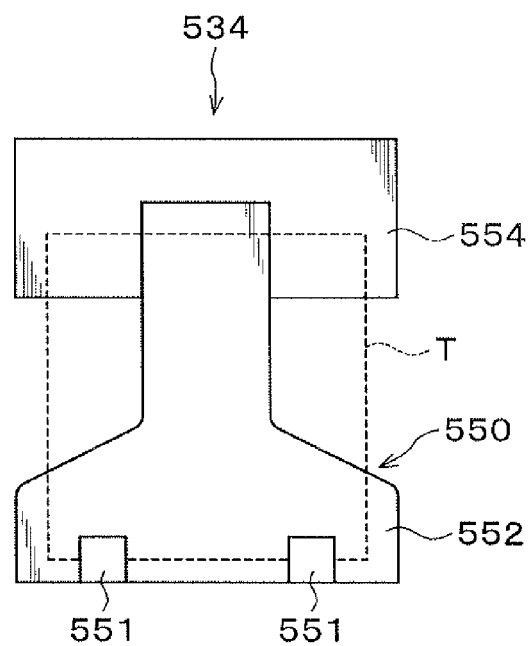
FIG. 24 is a side view showing the outline of the configuration of the carry unit.

Next, the configuration of the carry unit 534 will be described. The carry unit 534 has a carrying arm 550 for holding the templates T as shown in FIG. 23 and FIG. 24. The carrying arm 550 has a pair of arms 551, 551 configured to freely approach and depart and freely expand and contract, and a supporting member 552 for supporting the aims 551, 551. The supporting member 552 bends and supports the arms 551, 551 at its lower end portion. In the arm 551, holding grooves 553 for inserting and holding the templates T therein are formed. The holding grooves 553 are formed, for example, at five locations at predetermined intervals, so that the carrying arm 550 can hold, a plurality of, for example, 5 templates T in the vertically standing positions. Note that the predetermined intervals of the holding grooves 553 are the same as the intervals of holding grooves 515 formed in the holding parts 514 of the loader 511 and the unloader 521 as described above.

At a base end portion of the carrying arm 550, a supporting part 554 for supporting the carrying arm 550 is provided. Below the supporting part 554, a moving mechanism 556 is provided via a shaft 555. By means of the moving mechanism 556, the carrying arm 550 can move up and down. Further, the moving mechanism 556 is attached on the rail 535 so that the carry unit 534 can move along the rail 535.

Figure 25:
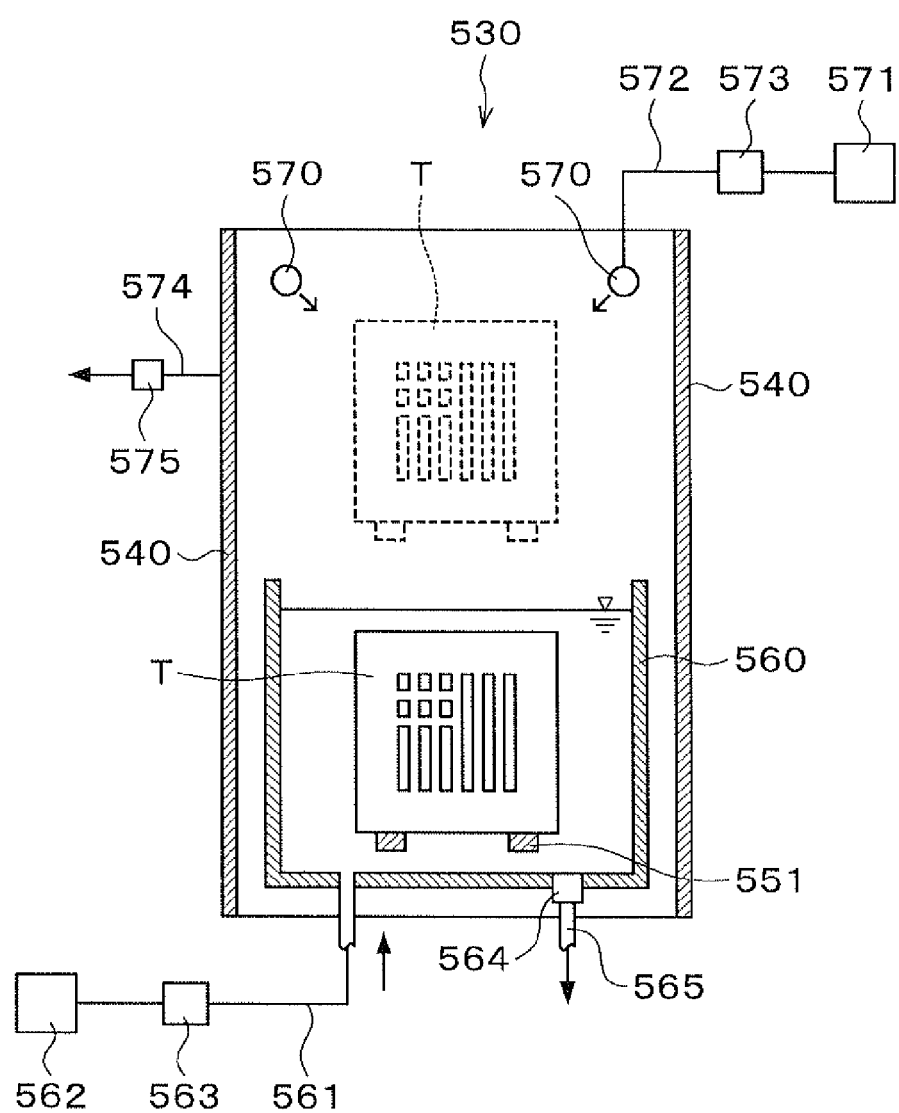
FIG. 25 is a longitudinal sectional view showing the outline of the configuration of a cleaning unit.

Next, the configurations of the treatment units 530 to 533 of the treatment station 502 will be described. The cleaning unit 530 has a cleaning solution bath 560 storing a cleaning solution therein as shown in FIG. 25. The cleaning solution bath 560 has an almost rectangular parallelepiped shape opening at its upper surface and having a size enough to house the template T therein. Accordingly, the cleaning solution bath 560 can immerse the plurality of templates T held by the carrying arm 550 of the carry unit 534 in the cleaning solution to remove impurities such as organic contaminants, particles and the like on the front surface of the template T to thereby clean the front surfaces of the templates T. Note that as the cleaning solution, for example, sulfuric acid-containing hydrogen peroxide solution is used.

To the bottom surface of the cleaning solution bath 560, a solution supply pipe 561 for supplying the cleaning solution into the cleaning solution bath 560 is connected. The solution supply pipe 561 communicates with a cleaning solution supply source 562 for supplying the cleaning solution. Along the solution supply pipe 561, a supply equipment group 563 is provided which includes a valve, a flow regulator and so on for controlling the flow of the cleaning solution. Further, a drain pipe 565 for draining the cleaning solution in the cleaning solution bath 560 is connected to the bottom surface of the cleaning solution bath 560 via a valve 564. The valve 564 can regulate the draining rate of the cleaning solution drained from the drain pipe 565.

Above the cleaning solution bath 560, gas nozzles 570 are provided which spray gas such an inert gas of nitrogen or dry air to the front surfaces of the plurality of templates T held in the carrying arm 550. By the gas sprayed from the gas nozzles 570, the front surfaces of the templates T which have been cleaned in the cleaning solution bath 560 can be dried. To the gas nozzles 570, a gas supply pipe 572 communicating with a gas supply source 571 is connected. Along the gas supply pipe 572, a supply equipment group 573 is provided which includes a valve, a flow regulator and so on for controlling the flow of the gas.

An exhaust pipe 574 for exhausting a chamber atmosphere in the cleaning unit 530 formed by closing the shutters 540 is connected to the side surface of the cleaning unit 530. Along the exhaust pipe 574, a valve 575 for regulating the exhaust rate is provided. Note that the exhaust pipe 574 may be provided on the side surface of the cleaning unit 530 facing the carrying arm 550 or may be provided on the shutter 540.

The other treatment units 531 to 533 also have the same configuration as that of the above-describe cleaning unit 530. The cleaning unit 531 has a pure water bath 580 storing pure water therein as shown in FIG. 21 in place of the cleaning solution bath 560 in the cleaning unit 530. The pure water bath 580 can immerse the plurality of templates T held by the carrying arm 550 of the carry unit 534 in the pure water to rinse-clean the front surfaces of the templates T. Note that the configuration of the pure water bath 580 is the same as the configuration of the above-described cleaning solution bath 560, and therefore the description thereof will be omitted. Further, the remaining configuration of the cleaning unit 531 is the same as the configuration of the above-described cleaning unit 530. For example, gas nozzles 570 spraying gas to the front surfaces of the plurality of templates T held in the carrying arm 550 are also provided above the pure water bath 580.

The release agent treatment unit 532 has a release agent bath 581 storing a liquid release agent therein, in place of the cleaning solution bath 560 in the cleaning unit 530. The release agent bath 581 can immerse a plurality of templates T held by the carrying arm 550 of the carry unit 534 in the release agent to make the release agent adhere to the front surfaces of the templates T. Note that the configuration of the release agent bath 581 is the same as the configuration of the above-described cleaning solution bath 560, and therefore the description thereof will be omitted. Further, the remaining configuration of the release agent treatment unit 532 is the same as the configuration of the above-described cleaning unit 530. For example, gas nozzles 570 spraying gas to the front surfaces of the plurality of templates T held in the carrying arm 550 are also provided above the release agent bath 581. Note that as the material of the release agent, a material having liquid repellency to the resist film to which the transfer pattern C of the template T is to be transferred, for example, a fluorocarbon-based compound or the like is used.

The alcohol treatment unit 533 has an alcohol bath 582 storing a liquid alcohol at room temperature, for example, ethanol, in place of the cleaning solution bath 560 in the cleaning unit 530. The alcohol bath 582 can immerse a plurality of templates T held by the carrying arm 550 of the carry unit 534 in the liquid alcohol to improve adhesiveness between the front surfaces of the templates T and the release agent. Note that the configuration of the alcohol bath 582 is the same as the configuration of the above-described cleaning solution bath 560, and therefore the description thereof will be omitted. Further, the remaining configuration of the alcohol treatment unit 533 is the same as the configuration of the above-described cleaning unit 530. For example, gas nozzles 570 spraying gas to the front surfaces of the plurality of templates T held in the carrying arm 550 are also provided above the alcohol bath 582. Note that the alcohol can be any one of alcohols, and alcohol other than ethanol may be used. For example, methanol, propanol, butanol, pentanol, hexanol, heptanol may be used, or a mixture of those alcohols may be used. Further, the concentration of alcohol is not particularly limited, but a concentration of 100% is preferable. Furthermore, though alcohol at room temperature is used in this embodiment, alcohol heated, for example, at 70° C. or lower may be used in order to prevent dew concentration of alcohol.

In the above template treatment apparatus 500, a control unit 600 is provided as shown in FIG. 21. The control unit 600 is, for example, a computer and has a program storage part (not shown). In the program storage part, a program is stored which controls the carry of the template T between the carry-in station 501 and the treatment station 502, the carry of the template T between the treatment station 502 and the carry-out station 503, the operation of the drive system in the treatment station 502 and so on to thereby execute the later-described template treatment in the template treatment apparatus 500. Note that this program may be the one that is stored, for example, in a computer-readable storage medium such as a computer-readable hard disk (HD), flexible disk (FD), compact disk (CD), magneto-optical disk (MO), or memory card, and installed from the storage medium into the control unit 600.

Figure 26:
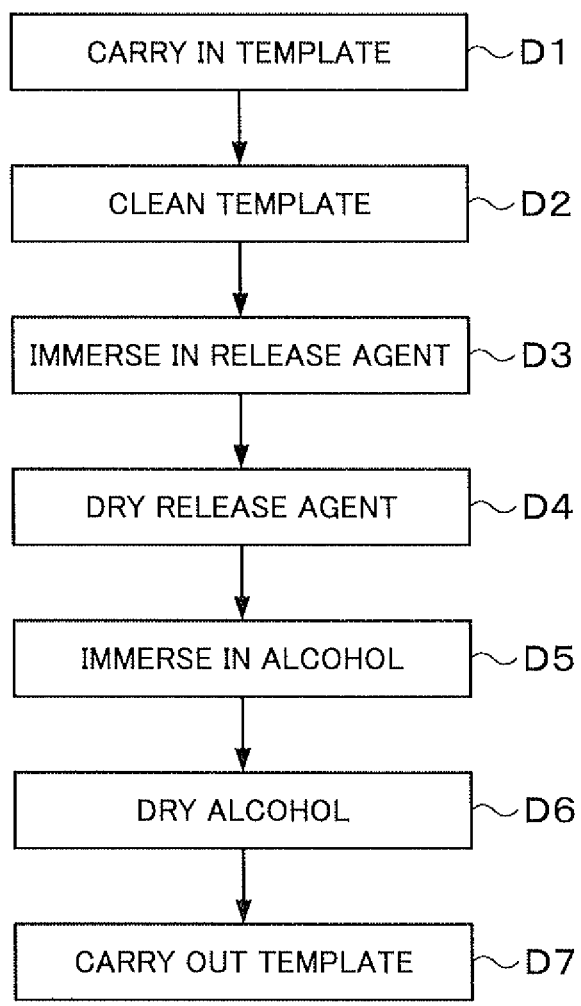
FIG. 26 is a flowchart showing steps of template treatment.

The template treatment apparatus 500 according to this embodiment is configured as described above. Next, the template treatment performed in the template treatment apparatus 500 will be described. FIG. 26 shows a main treatment flow of the template treatment, and FIGS. 27A to 27D show the states of the template T in respective steps.

First of all, a carrier $C_R$ housing a plurality of, for example, 5 templates T is carried into the template treatment apparatus 500 (Step D1 in FIG. 26). The carried-in carrier $C_R$ is mounted at a predetermined position on the carrier mounting table 510. Then, the carrier $C_R$ is moved to the transport unit 512 side along the opening portion 513 by the carrier carry unit provided in the carrier mounting table 510. The carrier $C_R$ is then held by the transport arm 516 of the transport unit 512 and transported from the carrier mounting table 510 to the loader 511. In the loader 511, the plurality of templates T are taken out of the carrier $C_R$ and held on the holding part 514. In this event, the templates T are inserted and held in the holding grooves 515 formed in the holding part 514. The plurality of templates T aligned and held on the holding part 514 are passed to and held by the carrying arm 550 of the carry unit 534.

Figure 27A:
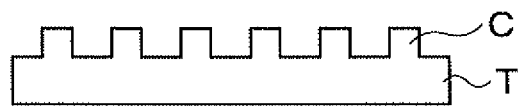
FIG. 27A is an explanatory view showing the appearance where the front surface of the template has been cleaned.

The plurality of templates T held by the carrying arm 550 are carried by the carry unit 534 to the cleaning unit 530. After the plurality of templates T are carried to a position above the cleaning solution bath 560, the shutters 540 on both sides of the cleaning unit 530 are closed. Thereafter, the carrying arm 550 is moved down to immerse the plurality of templates T in the cleaning solution stored in the cleaning solution bath 560. The cleaning solution removes impurities such as the organic contaminants, particles and the like on the front surface of the template T, whereby the front surface of the template T is cleaned as shown in FIG. 27A (Step D2 in FIG. 26). Then, the carrying arm 550 is moved up to above the cleaning solution bath 560. Subsequently, gas is sprayed from the gas nozzles 570 to the front surfaces of the plurality of templates T held by the carrying arm 550 to dry the front surfaces of the templates T.

Thereafter, the shutter 540 is opened, and the plurality of templates T held by the carrying arm 550 are carried to the cleaning unit 531. After the plurality of templates T are carried to above the pure water bath 580, the shutters 540 on both sides of the cleaning unit 531 are closed. Then, the carrying arm 550 is moved down to immerse the plurality of templates T in the pure water stored in the pure water bath 580. The pure water rinses the front surfaces of the templates T. Thereafter, the carrying arm 550 is moved up to above the pure water bath 580. Subsequently, gas is sprayed from the gas nozzles 570 to the front surfaces of the templates T held by the carrying arm 550 to dry the front surfaces of the templates T.

Figure 27B:
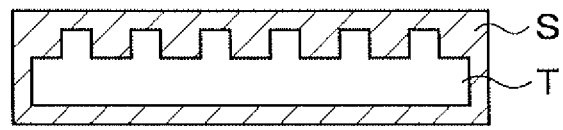
FIG. 27B is an explanatory view showing the appearance where the template is immersed in the release agent.

Thereafter, the shutter 540 is opened, and the plurality of templates T held by the carrying arm 550 are carried to the release agent treatment unit 532. After the plurality of templates T are carried to above the release agent bath 581, the shutters 540 on both sides of the release agent treatment unit 532 are closed. Then, the carrying arm 550 is moved down to immerse the plurality of templates T in the release agent stored in the release agent bath 581, for example, for 10 seconds (Step D3 in FIG. 26). Then, the release agent S adheres to the front surface of the template T as shown in FIG. 27B. Thereafter, the carrying arm 550 is moved up to above the release agent bath 581. Subsequently, gas is sprayed from the gas nozzles 570 to the front surfaces of the plurality of templates T held by the carrying arm 550, for example, for 20 seconds to dry the release agent S on the templates T (Step D4 in FIG. 26).

Figure 27C:
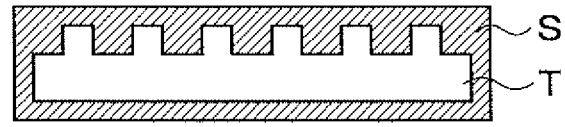
FIG. 27C is an explanatory view showing the appearance where the template having the release agent adhered to the front surface thereof is immersed in alcohol.
Figure 27D:
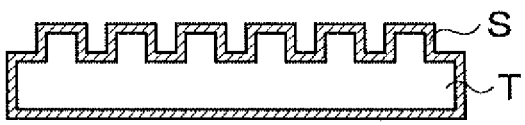
FIG. 27D is an explanatory view showing the appearance where a film of the release agent has been formed on the template.

Thereafter, the shutter 540 is opened, and the plurality of templates T held by the carrying arm 550 are carried to the alcohol treatment unit 533. After the plurality of templates T are carried to above the alcohol bath 582, the shutters 540 on both sides of the alcohol treatment unit 533 are closed. Then, the carrying arm 550 is moved down to immerse the plurality of templates T in the liquid alcohol stored in the alcohol bath 582, for example, for 10 seconds (Step D5 in FIG. 26). The alcohol makes the release agent S strongly and intimately chemically react with the front surface of the template T as shown in FIG. 27C so that the release agent S adheres to the front surface of the template T. Further, after the release agent S adheres to the front surface of the template T as described above, only an unreacted portion of the release agent S, that is, only a portion other than the portion of the release agent S which chemically reacts with the front surface of the template T and adheres to the front surface, is removed with the alcohol in the alcohol bath 532. In this event, since the release agent S adheres to the front surface of the template T, the release agent S within a predetermined distance from the front surface of the template T never peels off. Further, the contact angle of the release agent S on the template T is a predetermined angle, for example, 108 degrees so that the release agent S has sufficient liquid repellency to the resist film and can exhibit its release function. In this manner, a film of the release agent S along the transfer pattern C is formed in a predetermined film thickness on the template T as shown in FIG. 27D. Thereafter, the carrying arm 550 is moved up to above the alcohol bath 582. Subsequently, gas is sprayed from the gas nozzles 570 to the front surfaces of the plurality of templates T held by the carrying arm 550, for example, for 20 seconds to dry the alcohol on the templates T (Step D6 in FIG. 26).

Thereafter, the shutter 540 is opened, and the plurality of templates T held by the carrying arm 550 are carried to the unloader 521. In the unloader 521, the plurality of templates T held by the carrying arm 550 are passed to the holding part 514. In this event, the templates T are inserted and held in the holding grooves 515 formed in the holding part 514. Subsequently, the plurality of templates T are housed in the carrier $C_R$ prepared in advance in the unloader 521. The carrier $C_R$ is then held by the transport arm 516 of the transport unit 522 and transported from the unloader 521 to the carrier mounting table 520. After the carrier $C_R$ is mounted at a predetermined position on the carrier mounting table 520, the carrier $C_1$ is moved by the carrier carry unit provided inside the carrier mounting table 520 along the opening portion 513 to the opposite side to the transport unit 522. Thereafter, the carrier $C_R$ is carried out of the template treatment apparatus 500 (Step D7 in FIG. 26). Thus, a series of template treatment in the template treatment apparatus 500 ends, and the film of the release agent S along the transfer pattern C is formed in the predetermined film thickness on the front surface of the template T.

Note that after completion of the series of template treatment, the template T on which the film of the release agent S has been formed is carried, for example, from the template treatment apparatus 500 to the imprint unit (not shown). Then, in the imprint unit, the transfer pattern C of the template T is transferred on the resist film on the wafer. In this event, the resist on the wafer never adheres to the front surface of the template T owing to the release agent S. Accordingly, a predetermined pattern can be appropriately formed in the resist film on the wafer.

According to the above embodiment, since the template T to which the release agent S has adhered is immersed in the liquid alcohol in Step D5, the chemical reaction between the front surface of the template T and the release agent S is promoted, resulting in improved adhesiveness between the front surface of the template T and the release agent S. In other words, the release agent S can be made to adhere to the front surface of the template T in a short time. This can improve the throughput of the template treatment in Step D1 to Step D7.

Further, after the release agent S adheres to the front surface of the template T with alcohol in Step D5, only the unreacted portion of the release agent S is removed with the alcohol. Since the adhesiveness between the front surface of the template T and the release agent S and the removal of the unreacted portion of the release agent S are performed in the same step, the throughput of the template treatment can be further improved.

Further, since the predetermined treatments are performed collectively on the plurality of templates T in Step D2 to Step D6, the throughput of the template treatment can be further improved.

Further, since the release agent S adheres to the front surface of the template T in Step D5, the contact angle of the release agent S on the template T can be made a predetermined angle. Thus, the release agent S has sufficient liquid repellency to the resist film and can exhibit its release function.

Further, since the release agent is not heated, unlike the prior art, when the release agent S is made to adhere to the front surface of the template T in Step D5, the release agent S never thermally expands. Accordingly, a film of the release agent S can be appropriately formed on the front surface of the template T in a predetermined film thickness.

Further, since the front surface of the template T is cleaned in Step D2, the release agent S can be applied on the front surface of the template T in the predetermined film thickness in subsequent Step D3. Note that this Step D2 may be omitted when the front surface of the template T has been sufficiently cleaned in advance.

Further, since the cleaning unit 530 has the gas nozzles 570, the gas sprayed from the gas nozzles 570 can dry the front surface of the template T after the front surface of the template T is cleaned in Step D2. Therefore, the cleaning solution in the cleaning unit 530 never mixes into the pure water in the subsequent pure water bath 580. Similarly, since the cleaning unit 531 and the release agent treatment unit 532 also have the gas nozzles 570, the pure water in the cleaning unit 531 never mixes into the release agent in the subsequent release agent bath 581 and the release agent in the release agent treatment unit 532 never mixes into the alcohol in the subsequent alcohol bath 582. Further, since the alcohol treatment unit 533 also has the gas nozzles 570, the alcohol in the alcohol treatment unit 533 never adheres to the subsequent unloader 521.

Figure 28:
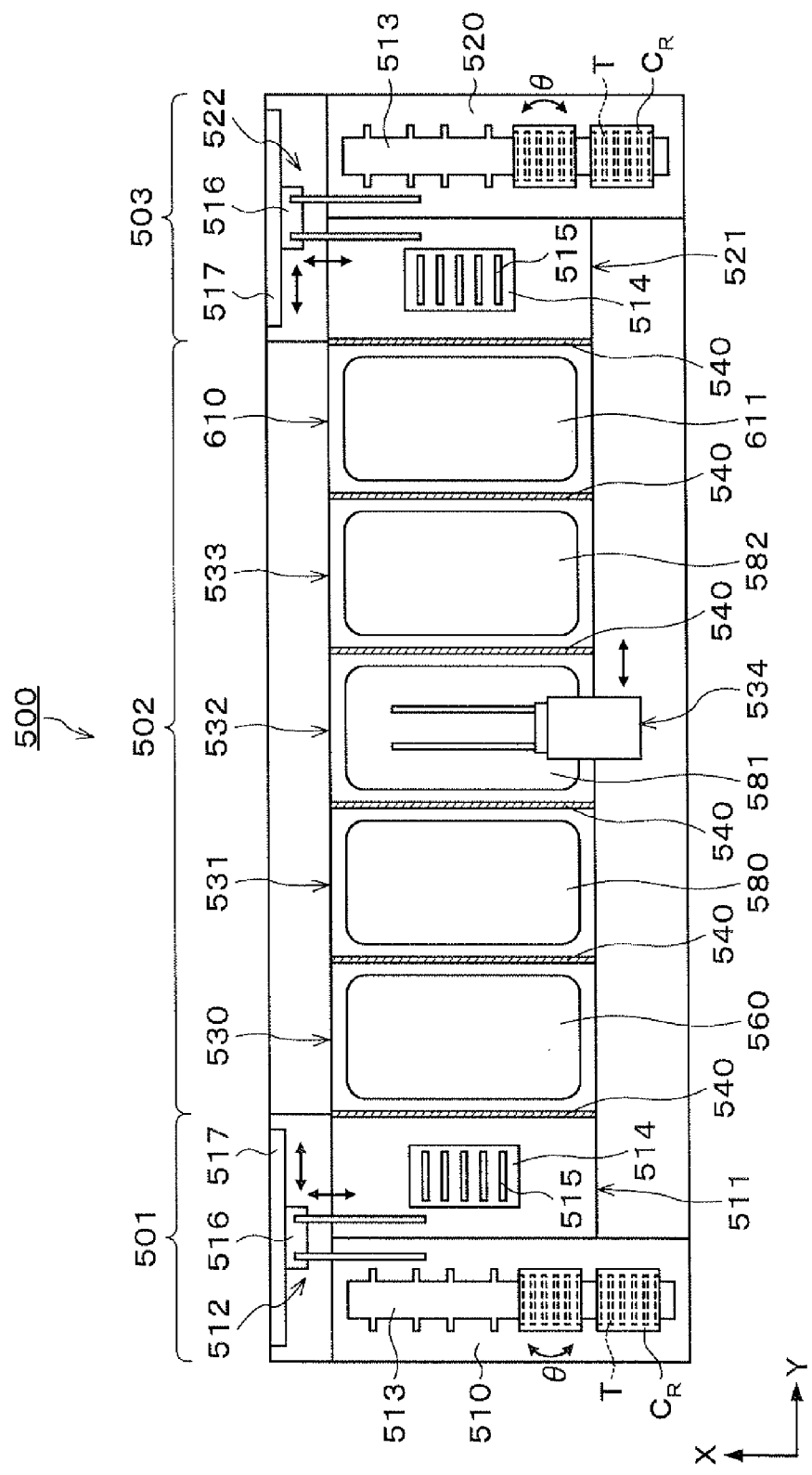
FIG. 28 is a plan view showing the outline of the configuration of a template treatment apparatus according to another embodiment.

The template treatment unit 500 in the above embodiment may further have a rinse unit for removing the unreacted portion of the release agent S on the template T with the rinse solution. In this case, a rinse unit 610 is placed on the downstream side of the alcohol treatment unit 533, that is, between the alcohol treatment unit 533 and the unloader 521 in the treatment station 502 as shown in FIG. 28. Further, shutters 540 which freely open and close are also provided on both sides of the rinse unit 610.

The rinse unit 610 has the same configuration as that of the cleaning unit 530 shown in FIG. 25 and has a rinse solution bath 611 storing a rinse solution therein, in place of the cleaning solution bath 560 in the cleaning unit 530. The rinse solution bath 611 can immerse the plurality of template T held by the carrying arm 550 of the carry unit 534 in the rinse solution to remove the unreacted portion of the release agent S on the template T. Note that the configuration of the rinse solution bath 611 is the same as the configuration of the above-described cleaning solution bath 560, and therefore the description thereof will be omitted. Further, the remaining configuration of the rinse unit 610 is the same as the configuration of the above-described cleaning unit 530. For example, gas nozzles 570 spraying gas to the front surfaces of the plurality of templates T held in the carrying arm 550 are also provided above the rinse solution bath 611. Note that as the rinse solution, for example, the solvent of the release agent S is used.

In this case, after the liquid alcohol on the templates T is dried and removed in Step D6, the shutter 540 is opened and the plurality of templates T held by the carrying arm 550 are carried to the rinse unit 610. After the plurality of templates T are carried to above the rinse solution bath 611, the shutters 540 on both sides of the rinse unit 610 are closed. Thereafter, the carrying arm 550 is moved down to immerse the plurality of templates T in the rinse solution stored in the rinse solution bath 611. The rinse solution peels off only the unreacted portion of the release agent S on the templates T. Thereafter, the carrying arm 550 is moved up to above the rinse solution bath 611. Subsequently, gas is sprayed from the gas nozzles 570 to the front surfaces of the plurality of templates T held by the carrying arm 550 to dry and remove the rinse solution on the templates T. After completion of the treatment in the rinse unit 610 in this manner, the plurality of templates T are housed in the carrier $C_R$ in the unloader 521, and the carrier $C_R$ transported to the carrier mounting table 520 is carried out of the template treatment apparatus 500 in Step D7. Note that Steps D1 to D7 are the same as those in the above embodiment, and therefore the description thereof will be omitted.

According to the above embodiment, even when the unreacted portion of the release agent S cannot be completely removed with alcohol in Step D5, the unreacted portion of the release agent S can be surely removed with the rinse solution. Accordingly, a film of the release agent S on the template T can be more surely formed in the predetermined film thickness.

Figure 29:
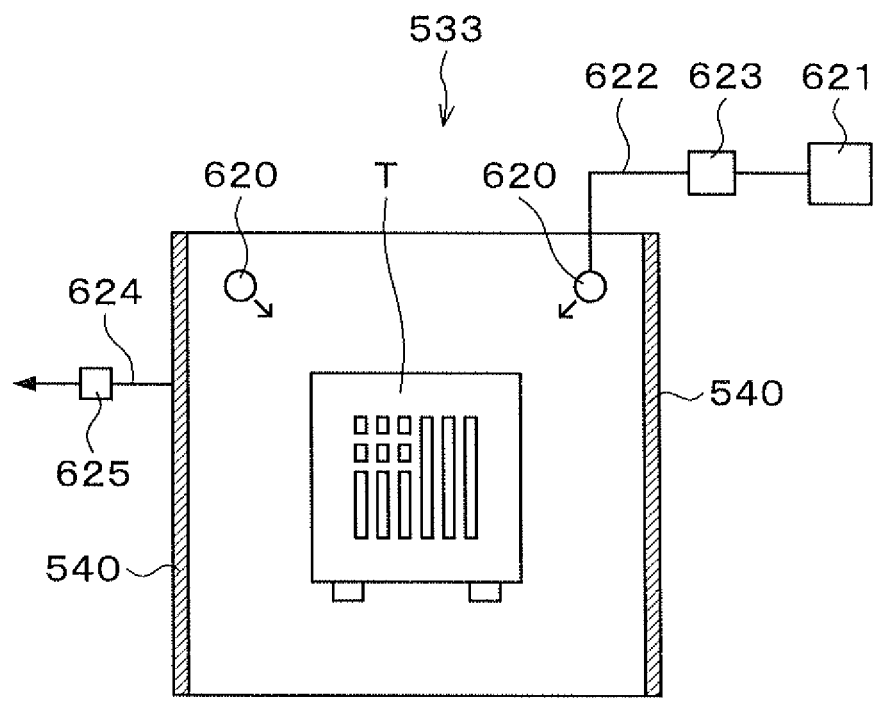
FIG. 29 is a longitudinal sectional view showing the outline of the configuration of an alcohol treatment unit according to another embodiment.

The alcohol treatment unit 533 has the alcohol bath 582 storing the liquid alcohol in the above embodiment but may have, for example, alcohol nozzles 620 as an alcohol supplying part for supplying a gaseous alcohol as shown in FIG. 29, in place of the alcohol bath 582. The alcohol nozzles 620 supply the gaseous alcohol into a chamber of the alcohol treatment unit 533 formed by closing the shutters 540. Note that the kind of the gaseous alcohol according to this embodiment is the same kind of the liquid alcohol stored in the alcohol bath 582 in the above embodiment, and therefore the description thereof will be omitted.

To the alcohol nozzles 620, a supply pipe 622 communicating with an alcohol supply source 621 is connected. Inside the alcohol supply source 621, a gaseous alcohol, for example, alcohol vapor is stored. Along the supply pipe 622, a supply equipment group 623 is provided which includes a valve, a flow regulator and so on for controlling the flow of the alcohol vapor.

An exhaust pipe 624 for exhausting a chamber atmosphere in alcohol treatment unit 533 is connected to the side surface of the alcohol treatment unit 533. Along the exhaust pipe 624, a valve 625 for regulating the exhaust rate is provided. Note that the exhaust pipe 624 may be provided on the side surface of the alcohol treatment unit 533 facing the carrying arm 550 or may be provided on the shutter 540.

In this case, the alcohol vapor is supplied into the alcohol treatment unit 533 from the alcohol nozzles 620 in Step D5 to maintain the alcohol atmosphere in the alcohol treatment unit 533. When the plurality of templates T held by the carrying arm 550 are carried into the alcohol treatment unit 533, the plurality of templates T are exposed to the alcohol atmosphere. The alcohol makes the release agent S strongly and intimately chemically react with the front surface of the template T so that the release agent S adheres to the front surface of the template T. Further, after the release agent S adheres to the front surface of the template T as described above, only an unreacted portion of the release agent S, that is, only a portion other than the portion of the release agent S which chemically reacts with the front surface of the template T and adheres to the front surface, is removed with the alcohol in the alcohol treatment unit 533. In this manner, a film of the release agent S along the transfer pattern C is formed in a predetermined film thickness on the template T.

Since the template T is exposed to the gaseous alcohol in this embodiment, the adhesiveness between the front surface of the template T and the release agent S can be improved. In this event, when the liquid alcohol is used, the release agent S on the template T may be swept away with the liquid alcohol, whereas when the gaseous alcohol is used as in this embodiment, the release agent S on the template T is never swept away. Accordingly, the contact angle of the release agent S on the template T can be made higher. Therefore, a film of the release agent S can be more appropriately formed on the template T.

Further, since the gaseous alcohol is used in this embodiment, it is unnecessary to dry the template T which has been subjected to the alcohol treatment. Therefore, in the alcohol treatment unit 533 in this embodiment, the gas nozzles 570 provided in the treatment unit 533 in the above embodiment can be omitted.

Note that though the alcohol nozzles 620 are used as the alcohol supplying part in this embodiment, various kinds of other mechanisms can be used as long as they can supply the gaseous alcohol into the alcohol treatment unit 533. Though the gaseous alcohol is supplied from the alcohol nozzles 620 in this embodiment, a misty alcohol may be supplied from the alcohol nozzles 620 instead of the gaseous alcohol. Also in this case, the template T is exposed to the misty alcohol, so that the adhesiveness between the front surface of the template T and the release agent S can be improved.

The cleaning units 530, 531 are separately provided in the above embodiment but may be formed as a cleaning unit of one-bus system. In this case, to the cleaning solution bath of the cleaning unit, the cleaning solution source for supplying the cleaning solution and the pure water supply source for supplying the pure water are connected. In this cleaning unit, the cleaning solution is first supplied into the cleaning solution bath. Subsequently, the plurality of templates T are immersed in the cleaning solution, whereby the front surfaces of the templates T are cleaned. Then, after the cleaning solution is drained from the cleaning solution bath, pure water is supplied into the cleaning solution bath. Subsequently, the plurality of templates T are immersed in the pure water, whereby the front surfaces of the templates T are rinse-cleaned. According to this embodiment, since the two cleaning units 530, 531 can be replaced with one cleaning unit, the template treatment apparatus 500 can be downsized.

Though the gases from the respective gas nozzles 570 are used to dry the front surface of the template T to prevent the treatment solutions in the treatment units 530 to 533, 610 from influencing the subsequent treatments in the treatment units 530 to 533, 610 in the above embodiment, a cleaning solution bath may be separately provided. In this cleaning solution bath, for example, pure water is stored. In this case, since the plurality of templates T after the treatments in the treatment units 530 to 533, 610 can be cleaned with the pure water, it is possible to surely prevent the treatment solutions in the treatment units 530 to 533, 610 from influencing the subsequent treatments.

In the template treatment apparatus 500 of the above embodiment, a cleaning solution bath for cleaning the carrying arm 550 of the carry unit 534 may be further provided in the treatment station 502. This can prevent influence on the subsequent treatments even when the treatment solutions such as the release agent, alcohol and so on adhere to the carrying arm 550.

In the treatment units 530 to 533, 610 of the above embodiment, a holding mechanism that holds the plurality of templates T and freely moves up and down may be provided. In this case, in the treatment units 530 to 533, 610, the plurality of templates T are passed from the carrying arm 550 to the holding mechanism. Then, predetermined treatments are performed on the plurality of templates T held on the holding mechanism. This ensures that while a plurality of templates T are being treated in one treatment unit, a plurality of other templates T can be carried to another treatment unit by the carrying arm 550. Thus, the throughput of the template treatment can be further improved.

Though one carry unit 534 is provided in the template treatment apparatus 500 of the above embodiment, two or more carry units 534 may be provided. This can improve the carry efficiency of the template T and further improve the throughput of the template treatment.

Preferred embodiments of the present invention have been described above with reference to the accompanying drawings, but the present invention is not limited to the embodiments. It should be understood that various changes and modifications are readily apparent to those skilled in the art within the scope of the technical spirit as set forth in claims, and those should also be covered by the technical scope of the present invention. The present invention is not limited to the embodiments but can take various forms. The present invention is also applicable to the case where the substrate is a substrate other than the wafer, such as an FPD (Flat Panel Display), a mask reticle for a photomask or the like.

What is claimed is:

1. A template treatment apparatus for forming a film of a release agent on a template having a transfer pattern formed on a treatment surface thereof, said apparatus comprising a coating unit,
   said coating unit comprising:
   the template;
   a rotating and holding member for holding and rotating the template;
   a release agent nozzle for supplying the release agent to the treatment surface of the template; and
   an alcohol nozzle for supplying alcohol to the release agent on the template,
   wherein said coating unit comprises a light irradiating part for irradiating the release agent on the template with light.

2. The template treatment apparatus as set forth in claim 1, wherein said coating unit comprises a light filter transmitting only light having a wavelength ranging from 350 nm to 2500 nm.

3. The template treatment apparatus as set forth in claim 1, wherein said coating unit comprises a rinse solution nozzle for supplying a rinse solution to the release agent on the template.

4. The template treatment apparatus as set forth in claim 1, further comprising:
   a rinse unit for removing an unreacted portion of the release agent applied to the treatment surface of the template in said coating unit, with a rinse solution.

5. The template treatment apparatus as set forth in claim 1, further comprising:
   a cleaning unit for cleaning the treatment surface of the template before the release agent is applied in said coating unit.

6. An imprint system comprising a template treatment apparatus for forming a film of a release agent on a template having a transfer pattern formed on a treatment surface thereof, said system comprising:
   an imprint unit for transferring the transfer pattern to a coating film formed on a substrate using the template having the film of the release agent formed on the treatment surface in said template treatment apparatus to thereby form a predetermined pattern in the coating film,
   said template treatment apparatus comprising a coating unit,
   said coating unit comprising:
   the template;
   a rotating and holding member for holding and rotating the template;
   a release agent nozzle for supplying the release agent to the treatment surface of the template; and
   an alcohol nozzle for supplying alcohol to the release agent on the template.

\* \* \* \* \*